US010256838B2

(12) United States Patent
Doi

(10) Patent No.: US 10,256,838 B2
(45) Date of Patent: Apr. 9, 2019

(54) DECODING APPARATUS, DECODING METHOD, AND COMPUTER PROGRAM PRODUCT

(71) Applicant: Kabushiki Kaisha Toshiba, Minato-ku (JP)

(72) Inventor: Kazuaki Doi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/044,569

(22) Filed: Feb. 16, 2016

(65) Prior Publication Data

US 2016/0329909 A1 Nov. 10, 2016

(30) Foreign Application Priority Data

May 8, 2015 (JP) ................................ 2015-095405

(51) Int. Cl.
*H03M 13/11* (2006.01)
*H04L 1/00* (2006.01)
*H03M 13/00* (2006.01)

(52) U.S. Cl.
CPC .... *H03M 13/1105* (2013.01); *H03M 13/1122* (2013.01); *H03M 13/6577* (2013.01); *H04L 1/0045* (2013.01)

(58) Field of Classification Search
CPC .......... H03M 13/1108; H03M 13/1111; H03M 13/1117; H03M 13/3707; H03M 13/3738;
(Continued)

(56) References Cited

U.S. PATENT DOCUMENTS 8,499,216 B2 * 7/2013 Yamaga .............. G06F 11/1012
714/755
2009/0282319 A1 * 11/2009 No .................... H03M 13/1108
714/780

(Continued)

FOREIGN PATENT DOCUMENTS

JP 4929342 5/2012
JP 5018807 9/2012
JP 2014-140111 7/2014

OTHER PUBLICATIONS

Toshiyuki Miyauchi et al. "High-Performance Programmable SISO Decoder VLSI Implementation for Decoding Turbo Codes", Global Telecommunications Conference, 2001, IEEE vol. 1, 2001, 5 pages.

(Continued)

*Primary Examiner* — Kyle Vallecillo
(74) *Attorney, Agent, or Firm* — Oblon, McClelland, Maier & Neustadt, L.L.P.

(57) ABSTRACT

According to an embodiment, a decoding apparatus for a low-density parity-check (LDPC) code includes a first calculator, a second calculator, and a selector. The first calculator is configured to perform row processing based on a first decoding algorithm. The second calculator is configured to perform row processing based on a second decoding algorithm having a lower error correction capacity than that of the first decoding algorithm. The selector is configured to select an output value from the row processing performed by the second calculator when an error in an output value from the row processing performed by the first calculator is greater than an error in the output value from the row processing performed by the second calculator.

10 Claims, 15 Drawing Sheets

(58) Field of Classification Search
CPC ......... H03M 13/1102; H03M 13/1194; H03M 13/136; H03M 13/15; H03M 13/1515; H03M 13/152; H03M 13/296
See application file for complete search history.

(56) References Cited

U.S. PATENT DOCUMENTS

| | | | | |
|---|---|---|---|---|
| 2014/0208182 | A1 | 7/2014 | Sakai et al. | |
| 2014/0380122 | A1* | 12/2014 | Myung ................ | G11C 16/349 714/764 |
| 2016/0241360 | A1* | 8/2016 | Motozuka .......... | H03M 13/1122 |
| 2016/0294415 | A1* | 10/2016 | Sugihara .............. | H03M 13/112 |

OTHER PUBLICATIONS

"On Implementation of Min-Sum Algorithm for Decoding Low-Density Parity Check (LDPC) Codes", Global Telecommunications Conference, Globecom '02, vol. 2, Nov. 17-21, 2002, 44 pages.

Lui Sakai et al. "Low Complexity Decoding Algorithm for LDPC Codes and its Discretized Density Evolution—Performance Evaluation for δ-Min Decoding by Discretized Density Evolution", IEICE Technical Report, 2005, 6 pages, (with English Abstract).

Jinghu Chen et al. "Density Evolution for Two Improved BP-Based Decoding Algorithms of LDPC Codes", IEEE Communications Letters, vol. 6, No. 5, May 2002, 3 pages.

Ming Jiang et al. "Adaptive Offset Min-Sum Algorithm for Low-Density Parity Check Codes", IEEE Communications Letters, vol. 10, No. 6, Jun. 2006, 3 pages.

Rong Chen et al. "Modified Normalized Min-Sum Decoding of LDPC Codes", ICSP2008 Proceedings, 2008, 4 pages.

G. Masera, et al., "Finite precision implementation of LDPC decoders", IEE Proceedings—Communications, vol. 152, No. 6, pp. 1098-1102, Dec. 2005.

Tadashi Wadayama, "Introduction to Low Density Parity Check Codes and the Sum-Product Algorithm", The Institute of Image Information and Television Engineers, vol. 25, No. 81, pp. 39-46, 2001, with computer-generated English translation.

* cited by examiner

FIG.5

$\Phi_1(x)=-\log(\tanh(x))$

| INPUT VALUE x (IN FIXED-POINT SYSTEM) | INPUT VALUE x (IN FLOATING-POINT SYSTEM) | OUTPUT VALUE $\Phi_1(x)$ (IN FIXED-POINT SYSTEM) | OUTPUT VALUE $\Phi_1(x)$ (IN FLOATING-POINT SYSTEM) |
|---|---|---|---|
| 0 | 0 | 353 | 5.515625 |
| 1 | 0.0625 | 178 | 2.78125 |
| 2 | 0.125 | 133 | 2.078125 |
| 3 | 0.1875 | 108 | 1.6875 |
| 4 | 0.25 | 90 | 1.40625 |
| 5 | 0.3125 | 76 | 1.1875 |
| 6 | 0.375 | 66 | 1.03125 |
| 7 | 0.4375 | 57 | 0.890625 |
| 8 | 0.5 | 49 | 0.765625 |
| 9 | 0.5625 | 43 | 0.671875 |
| 10 | 0.625 | 38 | 0.59375 |
| 11 | 0.6875 | 33 | 0.515625 |
| 12 | 0.75 | 29 | 0.453125 |
| 13 | 0.8125 | 26 | 0.40625 |
| 14 | 0.875 | 22 | 0.34375 |
| 15 | 0.9375 | 20 | 0.3125 |
| 16 | 1 | 17 | 0.265625 |

| INPUT VALUE x (IN FIXED-POINT SYSTEM) | INPUT VALUE x (IN FLOATING-POINT SYSTEM) | OUTPUT VALUE $\Phi_1(x)$ (IN FIXED-POINT SYSTEM) | OUTPUT VALUE $\Phi_1(x)$ (IN FLOATING-POINT SYSTEM) |
|---|---|---|---|
| 17 | 1.0625 | 15 | 0.234375 |
| 18 | 1.125 | 14 | 0.21875 |
| 19 | 1.1875 | 12 | 0.1875 |
| 20 | 1.25 | 11 | 0.171875 |
| 21 | 1.3125 | 9 | 0.140625 |
| 22 | 1.375 | 8 | 0.125 |
| 23 | 1.4375 | 7 | 0.109375 |
| 24 | 1.5 | 6 | 0.09375 |
| 25 | 1.5625 | 6 | 0.09375 |
| 26 | 1.625 | 5 | 0.078125 |
| 27 | 1.6875 | 4 | 0.0625 |
| 28 | 1.75 | 4 | 0.0625 |
| 29 TO 31 | 1.8125 TO 1.9375 | 3 | 0.046875 |
| 32 TO 35 | 2 TO 2.1875 | 2 | 0.03125 |
| 36 TO 44 | 2.25 TO 2.75 | 1 | 0.015625 |
| 45 TO 127 | 2.8125 TO 7.9375 | 0 | 0 |

BIT COUNT OF INPUT VALUE IN FIXED-POINT SYSTEM SETTING: 3 BITS FOR INTEGER PART, 4 BITS FOR DECIMAL PART
BIT COUNT OF OUTPUT VALUE IN FIXED-POINT SYSTEM SETTING: 4 BITS FOR INTEGER PART, 6 BITS FOR DECIMAL PART

FIG.6

$\Phi_2(x) = -\log(\tanh(x))$

| INPUT VALUE x (IN FIXED-POINT SYSTEM) | INPUT VALUE x (IN FLOATING-POINT SYSTEM) | OUTPUT VALUE $\Phi_2(x)$ (IN FIXED-POINT SYSTEM) | OUTPUT VALUE $\Phi_2(x)$ (IN FLOATING-POINT SYSTEM) |
|---|---|---|---|
| 0 | 0 | 44 | 5.5 |
| 1 | 0.0078125 | 39 | 4.875 |
| 2 | 0.015625 | 33 | 4.125 |
| 3 | 0.0234375 | 30 | 3.75 |
| 4 | 0.03125 | 28 | 3.5 |
| 5 | 0.0390625 | 26 | 3.25 |
| 6 | 0.046875 | 24 | 3 |
| 7 | 0.0546875 | 23 | 2.875 |
| 8 | 0.0625 | 22 | 2.75 |
| 9 | 0.0703125 | 21 | 2.625 |
| 10 | 0.078125 | 20 | 2.5 |
| 11 | 0.0859375 | 20 | 2.5 |
| 12 | 0.09375 | 19 | 2.375 |
| 13 | 0.1015625 | 18 | 2.25 |
| 14 | 0.109375 | 18 | 2.25 |
| 15 | 0.1171875 | 17 | 2.125 |
| 16 | 0.125 | 17 | 2.125 |
| 17 | 0.1328125 | 16 | 2 |
| 18 | 0.140625 | 16 | 2 |

| INPUT VALUE x (IN FIXED-POINT SYSTEM) | INPUT VALUE x (IN FLOATING-POINT SYSTEM) | OUTPUT VALUE $\Phi_2(x)$ (IN FIXED-POINT SYSTEM) | OUTPUT VALUE $\Phi_2(x)$ (IN FLOATING-POINT SYSTEM) |
|---|---|---|---|
| 19 | 0.1484375 | 15 | 1.875 |
| 20 | 0.15625 | 15 | 1.875 |
| 21 | 0.1640625 | 15 | 1.875 |
| 22 | 0.171875 | 14 | 1.75 |
| 23 | 0.1796875 | 14 | 1.75 |
| 24 TO 27 | 0.1875 TO 0.2109375 | 13 | 1.625 |
| 28 TO 30 | 0.21875 TO 0.234375 | 12 | 1.5 |
| 31 TO 35 | 0.2421875 TO 0.2734375 | 11 | 1.375 |
| 36 TO 40 | 0.28125 TO 0.3125 | 10 | 1.25 |
| 41 TO 46 | 0.3203125 TO 0.359375 | 9 | 1.125 |
| 47 TO 52 | 0.3671875 TO 0.40625 | 8 | 1 |
| 53 TO 61 | 0.4140625 TO 0.4765625 | 7 | 0.875 |
| 62 TO 70 | 0.484375 TO 0.546875 | 6 | 0.75 |
| 71 TO 82 | 0.5546875 TO 0.640625 | 5 | 0.625 |
| 83 TO 98 | 0.6484375 TO 0.765625 | 4 | 0.5 |
| 99 TO 119 | 0.7734375 TO 0.9296875 | 3 | 0.375 |
| 120 TO 151 | 0.9375 TO 1.1796875 | 2 | 0.25 |
| 152 TO 221 | 1.1875 TO 1.7265625 | 1 | 0.125 |
| 222 TO 1023 | 1.734375 TO 7.9921875 | 0 | 0 |

BIT COUNT OF INPUT VALUE IN FIXED-POINT SYSTEM SETTING: 3 BITS FOR INTEGER PART, 7 BITS FOR DECIMAL PART
BIT COUNT OF OUTPUT VALUE IN FIXED-POINT SYSTEM SETTING: 4 BITS FOR INTEGER PART, 3 BITS FOR DECIMAL PART

FIG.12A

| ROW WEIGHT | RATIO |
|---|---|
| 19 | 0.012987 |
| 20 | 0.084416 |
| 21 | 0.298701 |
| 22 | 0.545455 |
| 23 | 0.058442 |

| COLUMN WEIGHT | RATIO |
|---|---|
| 3 | 0.670628 |
| 11 | 0.329372 |

FIG.12B

| ROW WEIGHT | RATIO |
|---|---|
| 13 | 0.005208 |
| 16 | 0.03125 |
| 17 | 0.15625 |
| 18 | 0.5625 |
| 19 | 0.244792 |

| COLUMN WEIGHT | RATIO |
|---|---|
| 2 | 0.133929 |
| 3 | 0.613095 |
| 12 | 0.252976 |

FIG.12C

| ROW WEIGHT | RATIO |
|---|---|
| 11 | 0.02439 |
| 12 | 0.117886 |
| 13 | 0.560976 |
| 14 | 0.296748 |

| COLUMN WEIGHT | RATIO |
|---|---|
| 2 | 0.196672 |
| 3 | 0.571861 |
| 12 | 0.231467 |

FIG.13A

| | | | | | |
|---|---|---|---|---|---|
| SPA(Flo) | bER | 3.40E-02 | 3.35E-02 | 3.30E-02 | |
| | Decoding Failure Rate | 3.43E-01 | 4.94E-02 | 2.60E-03 | |
| Table-SPA | bER | 3.40E-02 | 3.35E-02 | 3.30E-02 | 3.20E-02 |
| | Decoding Failure Rate | 4.74E-01 | 1.03E-01 | 5.80E-03 | 0.00E+00 |
| Delta-MSA(Flo) | bER | 3.30E-02 | 3.20E-02 | 3.10E-02 | 3.00E-02 |
| | Decoding Failure Rate | 3.77E-01 | 1.00E-03 | 0.00E+00 | 0.00E+00 |
| SecondMin | bER | 3.40E-02 | 3.35E-02 | 3.30E-02 | 3.20E-02 |
| | Decoding Failure Rate | 3.82E-01 | 5.93E-02 | 2.70E-03 | 0.00E+00 |
| FirstMin | bER | 3.40E-02 | 3.35E-02 | 3.30E-02 | 3.20E-02 |
| | Decoding Failure Rate | 3.79E-01 | 5.66E-02 | 2.10E-03 | 0.00E+00 |
| SecondMin & Cnt | bER | 3.40E-02 | 3.35E-02 | 3.30E-02 | 3.20E-02 |
| | Decoding Failure Rate | 3.89E-01 | 6.29E-02 | 2.00E-03 | 0.00E+00 |
| Cnt | bER | 3.40E-02 | 3.35E-02 | 3.30E-02 | 3.20E-02 |
| | Decoding Failure Rate | 4.92E-01 | 9.39E-02 | 4.80E-03 | 0.00E+00 |

FIG.13B

| | | | | | | |
|---|---|---|---|---|---|---|
| SPA(Flo) | bER | 4.20E-02 | 4.10E-02 | 4.05E-02 | 4.00E-02 | |
| | Decoding Failure Rate | 1.62E-01 | 4.00E-04 | 0.00E+00 | 0.00E+00 | |
| Table-SPA | bER | 4.20E-02 | 4.10E-02 | 4.05E-02 | 4.00E-02 | 3.90E-02 |
| | Decoding Failure Rate | 1.62E-01 | 9.00E-04 | 4.00E-04 | 5.00E-04 | 8.82E-03 |
| Delta-MSA(Flo) | bER | 4.10E-02 | 4.00E-02 | 3.90E-02 | 3.80E-02 | |
| | Decoding Failure Rate | 2.37E-01 | 7.00E-04 | 0.00E+00 | 0.00E+00 | |
| SecondMin | bER | 4.20E-02 | 4.10E-02 | 4.05E-02 | 4.00E-02 | |
| | Decoding Failure Rate | 1.62E-01 | 6.00E-04 | 0.00E+00 | 0.00E+00 | |
| FirstMin | bER | 4.20E-02 | 4.10E-02 | 4.05E-02 | 4.00E-02 | |
| | Decoding Failure Rate | 1.65E-01 | 1.60E-03 | 3.00E-04 | 4.00E-04 | |
| SecondMin & Cnt | bER | 4.20E-02 | 4.10E-02 | 4.05E-02 | 4.00E-02 | |
| | Decoding Failure Rate | 1.63E-01 | 7.00E-04 | 0.00E+00 | 0.00E+00 | |
| Cnt | bER | 4.20E-02 | 4.10E-02 | 4.05E-02 | 4.00E-02 | |
| | Decoding Failure Rate | 2.69E-01 | 2.10E-03 | 0.00E+00 | 0.00E+00 | |

FIG.13C

| | | | | | |
|---|---|---|---|---|---|
| SPA(Flo) | bER | 6.00E-02 | 5.95E-02 | 5.90E-02 | |
| | Decoding Failure Rate | 3.80E-02 | 3.60E-03 | 2.00E-04 | |
| Delta-MSA(Flo) | bER | 5.90E-02 | 5.80E-02 | 5.70E-02 | 5.60E-02 |
| | Decoding Failure Rate | 2.11E-01 | 2.10E-03 | 0.00E+00 | 0.00E+00 |
| Table-SPA | bER | 6.00E-02 | 5.95E-02 | 5.90E-02 | 5.80E-02 |
| | Decoding Failure Rate | 8.11E-02 | 1.24E-02 | 4.00E-03 | 8.15E-02 |
| SecondMin | bER | 6.00E-02 | 5.95E-02 | 5.90E-02 | 5.80E-02 |
| | Decoding Failure Rate | 4.57E-02 | 3.40E-03 | 2.00E-04 | 0.00E+00 |
| FirstMin | bER | 6.00E-02 | 5.95E-02 | 5.90E-02 | 5.80E-02 |
| | Decoding Failure Rate | 7.58E-02 | 3.74E-02 | 3.05E-02 | 2.63E-02 |
| SecondMin & Cnt | bER | 6.00E-02 | 5.95E-02 | 5.90E-02 | 5.80E-02 |
| | Decoding Failure Rate | 4.44E-02 | 4.10E-03 | 0.00E+00 | 0.00E+00 |
| Cnt | bER | 6.00E-02 | 5.95E-02 | 5.90E-02 | 5.80E-02 |
| | Decoding Failure Rate | 9.63E-02 | 1.34E-02 | 9.00E-04 | 0.00E+00 |

DECODING APPARATUS, DECODING METHOD, AND COMPUTER PROGRAM PRODUCT

CROSS-REFERENCE TO RELATED APPLICATION

This application is based upon and claims the benefit of priority from Japanese Patent Application No. 2015-095405, filed on May 8, 2015; the entire contents of which are incorporated herein by reference.

FIELD

Embodiments described herein relate generally to a decoding apparatus, a decoding method, and a computer program product.

BACKGROUND

The low-density parity-check (LDPC) code is currently attracting attention as an error correcting code with error correction capacity extremely close to the Shannon limit that is theoretical limit of the information transfer rate. For example, many efforts are being made actively to implement the LDPC decoding apparatus using hardware, and to use the hardware implementation in communication systems and storage systems. While various types of LDPC code decoding algorithms are now available, the most popular decoding algorithm is the sum-product algorithm (SPA). The SPA is known to be a decoding algorithm with the highest error correction capacity.

However, when the scale of the circuit used for decoding LDPC codes is limited, or when the decoding apparatus has limited resources such as a memory that can be assigned to a computer program executing the LDPC code decoding, precise execution of the LDPC code decoding process has been difficult.

BRIEF DESCRIPTION OF THE DRAWINGS

FIG. 5 is a schematic illustrating exemplary settings of a $\phi_1$ table according to the embodiment;

FIG. 6 is a schematic illustrating exemplary settings of a $\phi_2$ table according to the embodiment;

FIG. 12A is a schematic illustrating a first exemplary check matrix according to the modification;

FIG. 12B is a schematic illustrating a second exemplary check matrix according to the modification;

FIG. 12C is a schematic illustrating a third exemplary check matrix according to the modification;

FIG. 13A is a schematic presenting values of results of a simulation performed with the first exemplary check matrix;

FIG. 13B is a schematic presenting values of results of a simulation performed with the second exemplary check matrix;

FIG. 13C is a schematic presenting values of results of a simulation performed with the third exemplary check matrix;

DETAILED DESCRIPTION

According to an embodiment, a decoding apparatus for a low-density parity-check (LDPC) code includes a first calculator, a second calculator, and a selector. The first calculator is configured to perform row processing based on a first decoding algorithm. The second calculator is configured to perform row processing based on a second decoding algorithm having a lower error correction capacity than that of the first decoding algorithm. The selector is configured to select an output value from the row processing performed by the second calculator when an error in an output value from the row processing performed by the first calculator is greater than an error in the output value from the row processing performed by the second calculator.

A decoding apparatus, a decoding method, and a computer program according to an embodiment will now be explained in detail with reference to the accompanying drawings.

Figure 1:
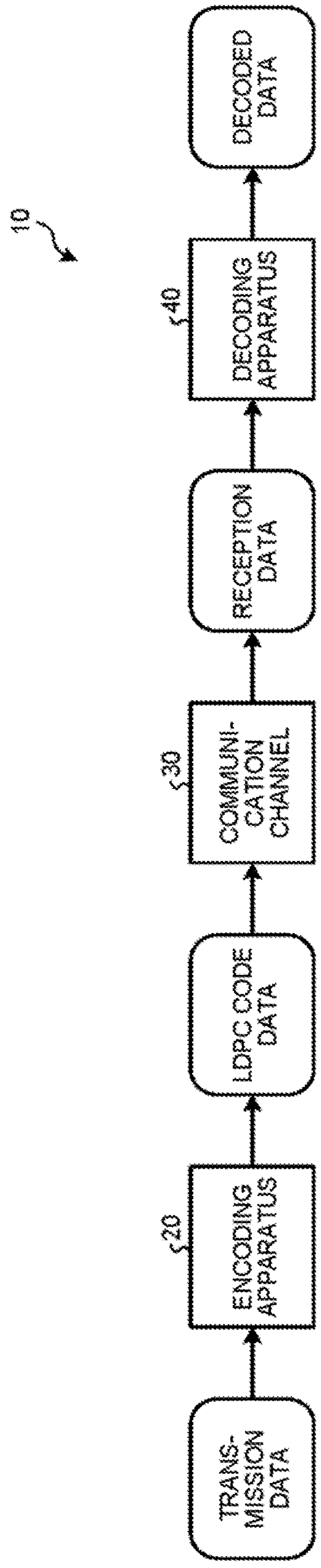
FIG. 1 is a schematic illustrating an exemplary configuration of a communication system according to an embodiment.

FIG. 1 is a schematic illustrating an exemplary configuration of a communication system according to the embodiment. This communication system 10 according to the embodiment includes an encoding apparatus 20, a communication channel 30, and a decoding apparatus 40. The encoding apparatus 20 generates LDPC code data by multiplying a generator matrix G to a piece of transmission data that is to be transmitted over the communication channel 30. The communication channel 30 is a medium used for transmitting the LDPC code data. The communication channel 30 may be a wireless channel or a wired channel, or may be a combination of a wireless channel and a wired channel.

When the reception data is received over the communication channel 30, the decoding apparatus 40 generates the decoded data (LDPC code data) by correcting errors in the reception data using a check matrix H. Each component of the check matrix H is either 0 or 1. A check matrix H for an LDPC code is a sparse matrix with a small number of 1. The generator matrix G and the check matrix H satisfy a relation of $GH^T=0$, where $H^T$ is a transposed matrix of H.

A decoding operation using the check matrix H indicated in Equation (1) will now be explained, with reference to an exemplary configuration of the decoding apparatus 40 according to the embodiment.

$$H=\begin{bmatrix}0&1&1&1&0&0\\1&0&0&1&1&0\\0&0&1&0&1&1\end{bmatrix} \quad (1)$$

The check matrix H represented in Equation (1) is an exemplary check matrix with three rows and six columns. The check matrix H represented in Equation (1) has a row weight of 3, and a column weight of 1 or 2. The row weight represents the number of components "1" in one row, and the column weight represents the number of components "1" in one column. Explained in the embodiment is an example in which the decoding apparatus 40 uses the check matrix H represented in Equation (1), but the check matrix H may be any check matrix, without limitation to that represented in Equation (1).

Figure 2:
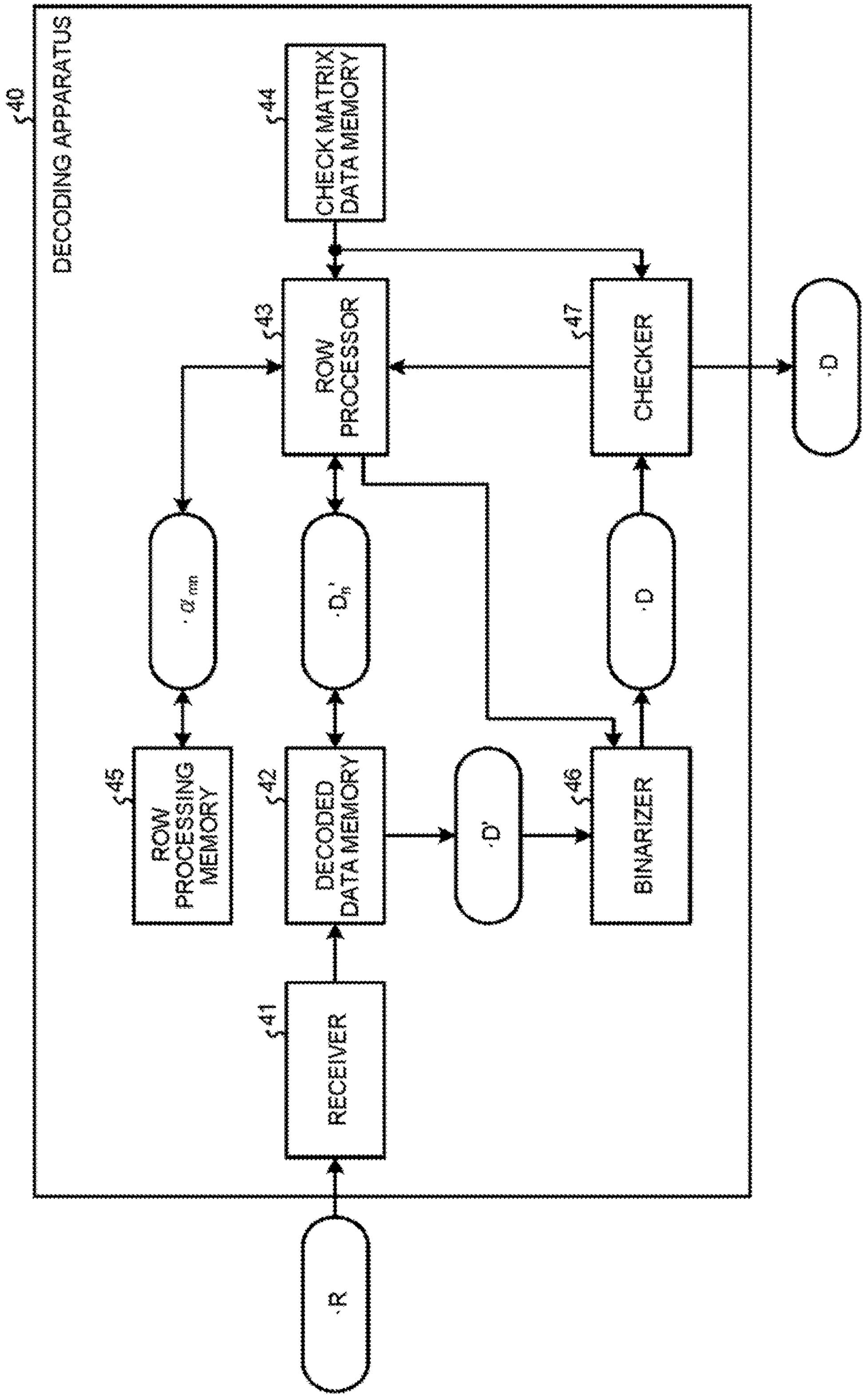
FIG. 2 is a schematic illustrating an exemplary configuration of a decoding apparatus according to the embodiment.

FIG. 2 is a schematic illustrating an exemplary configuration of the decoding apparatus 40 according to the embodiment. The decoding apparatus 40 according to the embodiment includes a receiver 41, a decoded data memory 42, a row processor 43, a check matrix data memory 44, a row processing memory 45, a binarizer 46, and a checker 47.

When the receiver 41 receives reception data R from the encoding apparatus 20 over the communication channel 30, the receiver 41 calculates initial values $D'_n$(init) of analog decoded data $D'_n$ based on the reception data R and a model of the communication channel 30, and stores the initial value in the decoded data memory 42. Where "n" denotes a column number in the check matrix (data number), and takes a value from one to six. The analog decoded data $D'_n$ is expressed as Equation (2) below.

$$D'_n = \log\frac{P(D_n=0)}{P(D_n=1)} \quad (2)$$

Where $P(D_n=0)$ represents the probability at which a piece of binary decoded data $D_n$ is 0, and $P(D_n=1)$ represents the probability at which $D_n$ is 1. If $P(D_n=0)>P(D_n=1)$, the decoded data $D'_n$ will be a positive number. When this value is greater, $D_n$ is more likely to be 0. If $P(D_n=0)<P(D_n=1)$, the decoded data $D'_n$ will be a negative number. When this value is smaller, $R_n$ is more likely to be 1. If $P(D_n=0)=P(D_n=1)$, the decoded data $D'_n$ will be 0, indicating that the probability of $R_n$ being 0 is equal to the probability of $R_n$ being 1.

The initial value $D'_n$(init) of $D'_n$ is calculated from the reception data and the communication channel model, as expressed as Equation (3) below.

$$D'_n(init) = \log\frac{P(R_n=0)}{P(R_n=1)} \quad (3)$$

The bit count of one piece of reception data R may be any number. Explained in the embodiment is an example in which the reception data R has a data length of six, and $D'_1$(init) to $D'_6$(init) calculated from reception data R (=($R_1$, $R_2$, $R_3$, $R_4$, $R_5$, $R_6$)) are stored in the decoded data memory 42.

After the receiver 41 stores $D'_n$(init) in the decoded data memory 42, the row processor 43 initializes the row processing memory 45. The row processing memory 45 stores therein $\alpha_m=(\alpha_{m1}, \alpha_{m2}, \alpha_{m3}, \alpha_{m4}, \alpha_{m5}, \alpha_{m6})$ that are probability values for a row processing operation. Where "m" denotes a row number in the check matrix, and takes a value from 1 to 3. The row processing operation probability value is the logarithmic probability ratio of the decoded data $D_n$, with a focus on the row processing operation of the $m^{th}$ row, and represented as following Equation (4).

$$\alpha_{mn} = \log\frac{P(D_n=0)_{(at\ row(m)calculation\ n)}}{P(D_n=1)_{(at\ row(m)calculation\ n)}} \quad (4)$$

The denominator and the numerator in Equation (4) are the same as those in Equation (2), except that the focus is on the row processing of the $m^{th}$ row, and explanations thereof are therefore omitted herein. Because, before the decoding apparatus 40 performs any decoding, the row processor 43 has not performed any row processing, it is completely unknown whether the decoded data is 0 or 1. Therefore, the row processor 43 initializes every α to 0.

After the decoded data memory 42 and the row processing memory 45 are initialized, the row processor 43 performs the row processing. The row processor 43 corrects errors in the analog reception data R by repeating the row processing at each row of the check matrix H. The row processing is a process of updating the decoded data $D'_n$, and the row processing operation probability value $\alpha_{mn}$.

Specifically, to begin with, the row processor 43 reads the check matrix H from the check matrix data memory 44.

The row processor 43 then reads the analog decoded data $D'_n$ from the decoded data memory 42, and reads the row processing operation probability value $\alpha_{mn}$ from the row processing memory 45. Where "m" denotes a row number in the check matrix H, and "n" denotes a column number of the component "1" included in the row to be row-processed.

After reading the row processing operation probability value $\alpha_{mn}$ and the decoded data $D'_n$, the row processor 43 performs the row processing at each row in the check matrix H. Every time the row processing at each row of the check matrix H is performed, the decoded data $D'_n$ is updated, and the row processing operation probability value $\alpha_{mn}$ is updated.

For example, in the row processing at the first row of the check matrix H represented in Equation (1), because the columns with the column numbers 2, 3, and 4 have a component "1", the decoded data $D'_2$, $D'_3$, and $D'_4$ is updated. When the row processor 43 performs the row processing of the first row, the row processor 43 reads the decoded data $D'_n$ (n=2, 3, 4) from the decoded data memory 42. The row processor 43 then updates the decoded data $D'_n$ (n=2, 3, 4) in the decoded data memory 42, with the decoded data $D'_n$ (n=2, 3, 4) resultant of the row processing of the first row. For the row processing operation probability values, because the columns with the column numbers 2, 3, and 4 have a component "1", the row processing probability values $\alpha_{12}$, $\alpha_{13}$, and $\alpha_{14}$ are read and updated. The row processing performed by the row processor 43 will be explained in detail later.

When the row processing is completed, the row processor 43 inputs a request for reading the analog decoded data $D'=(D'_1, D'_2, D'_3, D'_4, D'_5, D'_6)$ to the binarizer 46. For example, in the example of the row processing with the check matrix H represented in Equation (1), when the row processing with the third row of the check matrix H is completed, the row processor 43 inputs a reading request to the binarizer 46.

When the binarizer 46 receives the reading request from the row processor 43, the binarizer 46 reads the analog decoded data $D'=(D'_1, D'_2, D'_3, D'_4, D'_5, D'_6)$ from the decoded data memory 42. The binarizer 46 then converts the analog decoded data $D'=(D'_1, D'_2, D'_3, D'_4, D'_5, D'_6)$ into binary decoded data $D=(D_1, D_2, D_3, D_4, D_5, D_6)$ through threshold determination. In other words, each $D_n$ is either "0" or "1". The binarizer 46 then inputs the binary decoded data D to the checker 47.

When the binary decoded data $D=(D_1, D_2, D_3, D_4, D_5, D_6)$ is received from the binarizer 46, the checker 47 checks the parity of the decoded data D. Specifically, the checker 47 reads the check matrix H from the check matrix data memory 44, and calculates a syndrome S as $S=D\times H^T=(S_1, S_2, S_3)$.

If $S\neq(0, 0, 0)$, the checker 47 inputs a notification for re-execution of the row processing to the row processor 43. When the notification of re-execution is received from the checker 47, the row processor 43 performs the second cycle of the row processing, starting from the first row of the check matrix H, using the analog decoded data $D'=(D'_1, D'_2, D'_3, D'_4, D'_5, D'_6)$, and the row processing operation probability values $\alpha_{mn}$ updated in the first cycle of the row processing.

The row processing performed by the row processor 43 is repeated until $S=(0, 0, 0)$ is achieved, or a predetermined decoding iteration count (fourth threshold) is reached. As the initial values of the analog decoded data D' and of the probability values $\alpha_{mn}$ used in the $N^{th}$ cycle of the row processing, the values acquired from the $(N-1)^{th}$ row processing are used. When $S=(0, 0, 0)$ is not achieved although the predetermined repeated decoding iteration count (fourth threshold) is reached, the decoded data D cannot be acquired from the reception data R, and the decoding fails.

When $S=(0, 0, 0)$ is achieved, the checker 47 outputs the decoded data $D=(D_1, D_2, D_3, D_4, D_5, D_6)$. If $S\neq(0, 0, 0)$ and the predetermined repeated decoding iteration count is reached, the checker 47 outputs an error indicating that the digital decoded data $D=(D_1, D_2, D_3, D_4, D_5, D_6)$ cannot be acquired from the reception data $R=(R_1, R_2, R_3, R_4, R_5, R_6)$.

The row processing performed by the row processor 43 will now be explained specifically.

Figure 3:
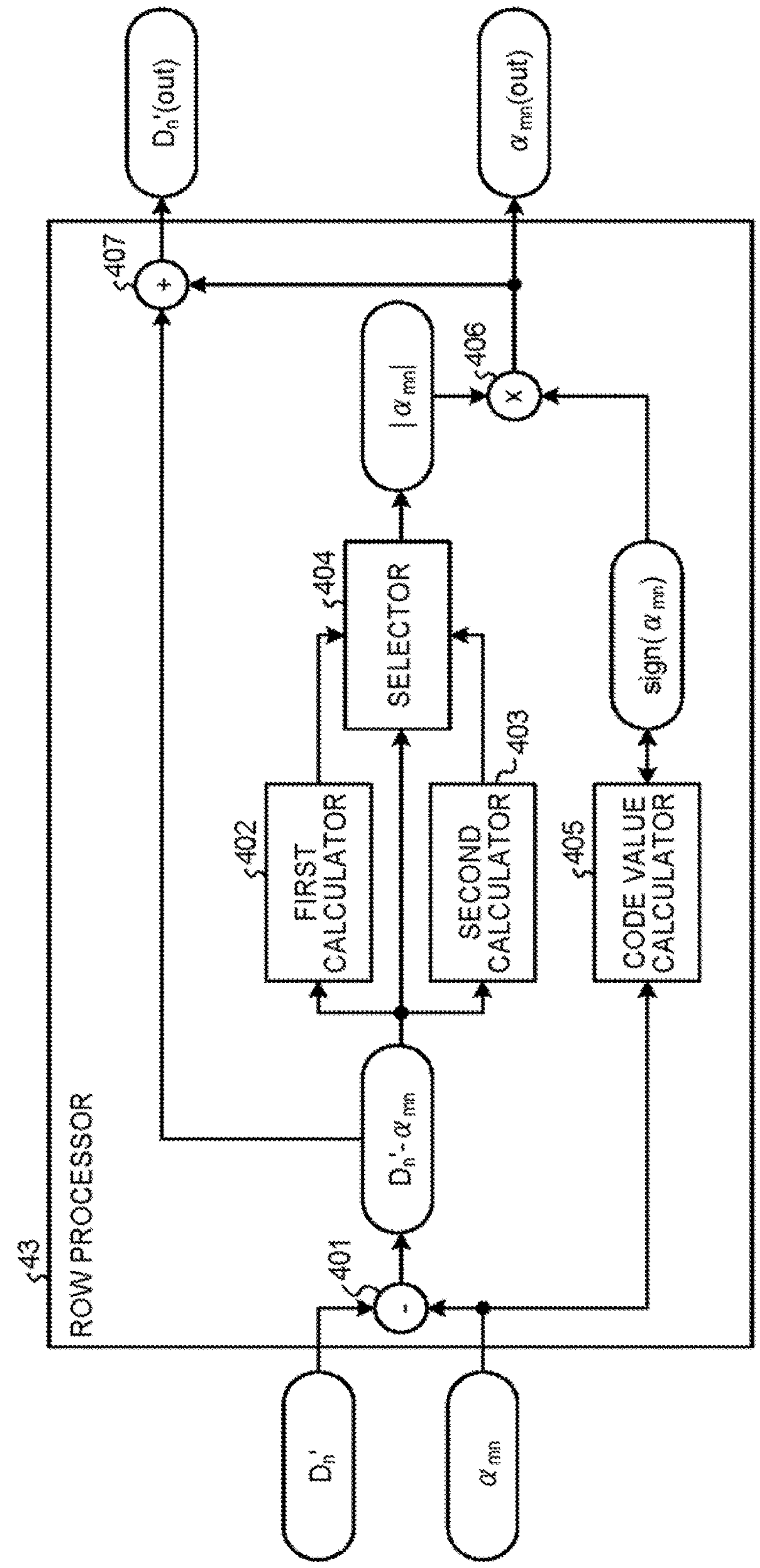
FIG. 3 is a schematic illustrating an exemplary configuration of a row processor according to the embodiment.

FIG. 3 is a schematic illustrating an exemplary configuration of the row processor 43 according to the embodiment. The row processor 43 according to the embodiment includes a subtractor 401, a first calculator 402, a second calculator 403, a selector 404, a code value calculator 405, a multiplier 406, and an adder 407.

The subtractor 401 reads the analog decoded data $D'_n$ from the decoded data memory 42, and reads the row processing operation probability value $\alpha_{mn}$ from the row processing memory 45, and calculates $D'_n-\alpha_{mn}$. The subtractor 401 inputs $D'_n-\alpha_{mn}$ to the first calculator 402, the second calculator 403, the selector 404, and the adder 407.

When $D'_n-\alpha_{mn}$ is received from the subtractor 401, the first calculator 402 calculates $|\alpha_{mn}|$ that is the absolute value of $\alpha_{mn}$, by performing row processing that is based on a decoding algorithm with a higher error correction capacity than that used by the second calculator 403. In the embodiment described herein, it is assumed that the decoding algorithm used by the first calculator 402 is SPA having the operation of Gallager's function $f(x)=-\log(\tan h(x/2))$ replaced by an operation using tables storing therein pairs of an input value x and an output value f(x).

The row processing performed by the first calculator 402 will now be explained in detail.

Figure 4:
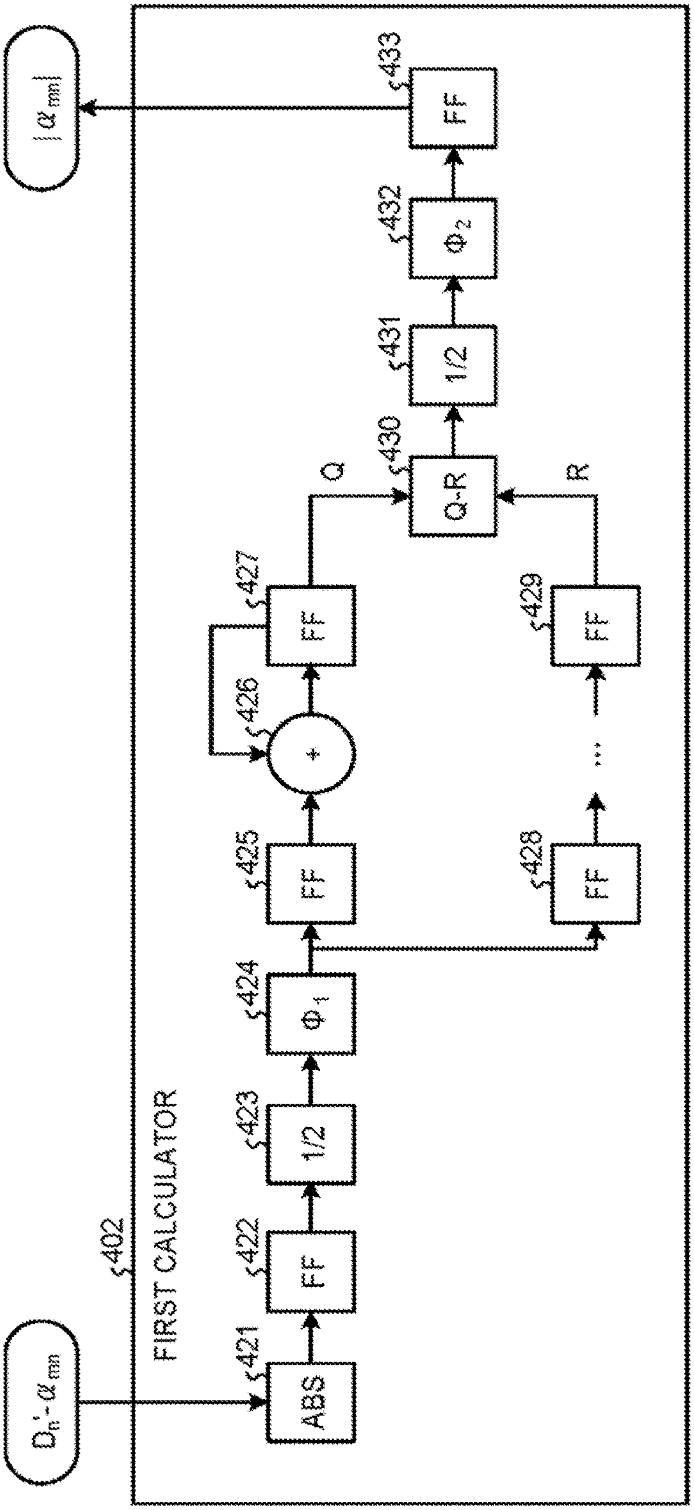
FIG. 4 is a schematic illustrating an exemplary configuration of a first calculator according to the embodiment.

FIG. 4 is a schematic illustrating an exemplary configuration of the first calculator 402 according to the embodiment. The first calculator 402 according to the embodiment includes an absolute value (ABS) calculator 421, a flip-flop (FF) 422, a ½ divider 423, a $\phi_1$ unit 424, an FF 425, an adder 426, an FF 427, an FF 428, an FF 429, a Q-R calculator 430, a ½ divider 431, a $\phi_2$ unit 432, and an FF 433.

The first calculator 402 performs the operation of Equation (5) below.

$$|\alpha_{mn}| = \phi_2\left(\left(\sum_{n'\in A(m)\backslash n} \phi_1(|D'_{n'} - \alpha_{mn'}|/2)/2\right)\right) \tag{5}$$

Where m denotes the row number of the check matrix H, and n denotes a column number in the check matrix H.

A(m) represents a set of a column number including a component "1" in the row to be row-processed. For example, in the exemplary check matrix H represented in Equation (1), A(1)={2, 3, 4}, A(2)={1, 4, 5}, and A(3)={3, 5, 6}.

A(m)\n represents the set-theoretic difference. For example, in the exemplary check matrix H represented in Equation (1), A(1)\2={3, 4}, A(1)\3={2, 4}, and A(1)\4={2, 3}.

$\phi_1$ and $\phi_2$ are tables for executing Gallager's function $f(x)=-\log\{\tan h(x/2)\}$. In the embodiment, the tables store a mapping relation between an input value x and an output value $\phi_1(x)$ ($\phi_2(x)$) in $\phi_1=\phi_2=-\log\{\tan h(x)\}$.

FIG. 5 is a schematic illustrating exemplary settings of the $\phi_1$ table according to the embodiment. FIG. 5 presents an example in which the input value x has 7 bits (3 bits for integer part, 4 bits for decimal part), and the output value from $\phi_1(x)$ has 10 bits (4 bits for integer part, 6 bits for decimal part). For example, an input value x of 1 can be expressed by a 7-bit binary as 0000001. Because the less significant 4 bits represent the decimal part, when the input value x is 1, the input value can be expressed as 1/16=0.0625 in the floating-point system. As another example, when the input value x is 1, the output value $\phi_1(1)$ is 178. 178 can be expressed as 0010110010 in the 10-bit binary system. Because the most significant 4 bits represents the integer part, and the less significant 6 bits represents the decimal part, the output value $\phi_1(x)$ of 178 is expressed as 2+½+¼+1/32=2.78125 in the floating-point system.

FIG. 6 is a schematic illustrating exemplary settings of the $\phi_2$ table according to the embodiment. FIG. 6 presents an example in which the input value x has 10 bits (3 bits for integer part, 7 bits for decimal part), and the output value $\phi_2(x)$ has 7 bits (4 bits for integer part, 3 bits for decimal part). Because the explanation of the $\phi_2$ table presented in FIG. 6 is the same as that of the $\phi_1$ table illustrated in FIG. 5, explanation of the former is omitted herein.

Resources required in the LDPC code decoding process can be reduced by causing the first calculator 402 to perform the operation of Gallager's function $f(x)=-\log\{\tan h(x/2)\}$ using the $\phi$1 table and the $\phi_2$ table.

Referring back to FIG. 4, the process performed by the first calculator 402 will now be explained specifically, using the exemplary row processing at the first row of the check matrix H represented in Equation (1). Because m=1, and A(1)={2, 3, 4}, the ABS calculator 421 receives $D'_2-\alpha_{12}$, $D'_3-\alpha_{13}$, and $D'_4-\alpha_{14}$ sequentially from subtractor 401. The ABS calculator 421 sequentially calculates the absolute values $|D'_2-\alpha_{12}|$, $|D'_3-\alpha_{13}|$, and $|D'_4-\alpha_{14}$, and sequentially inputs the absolute values $|D'_2-\alpha_{12}|$, $|D'_3-\alpha_{13}|$, and $|D'_4-\alpha_{14}|$ to the FF 422.

The ½ divider 423 sequentially reads the absolute values $|D'_2-\alpha_{12}|$, $|D'_3-\alpha_{13}|$, and $|D'_4-\alpha_{14}|$ from the FF 422, and divides each of the absolute values by 2. The ½ divider 423 then inputs the absolute values $|D'_2-\alpha_{12}|/2$, $|D'_3-\alpha_{13}|/2$, and $|D'_4-\alpha_{14}|/2$ sequentially to the $\phi_1$ unit 424.

When the absolute values $|D'_2-\alpha_{12}|/2$, $|D'_3-\alpha_{13}|/2$, and $|D'_4-\alpha_{14}|/2$ are sequentially received from the ½ divider 423, the $\phi_1$ unit 424 sequentially calculates $\phi_1(|D'_2-\alpha_{12}|/2)$, $\phi_1(|D'_3-\alpha_{13}|/2)$, and $\phi_1(|D'_4-\alpha_{14}|/2)$ by referring to the $\phi_1$ table (see FIG. 5). The $\phi_1$ unit 424 inputs $\phi_1(|D'_2-\alpha_{12}|/2)$, $\phi_1(|D'_3-\alpha_{13}|/2)$, and $\phi_1(|D'_4-\alpha_{14}|/2)$ sequentially to the FF 425. The $\phi_1$ unit 424 also inputs $\phi_1(|D'_2-\alpha_{12}|/2)$, $\phi_1(|D'_3-\alpha_{13}|/2)$, and $\phi_1(|D'_4-\alpha_{14}|/2)$ sequentially to the FF 428.

The FF 425, the adder 426, and the FF 427 calculate a calculated value Q from the Equation (6) below.

$$Q=\sum_{n'\in A(m)}\phi_1(|D'_{n'}-\alpha_{mn'}|/2) \tag{6}$$

In the row processing at the first row of the check matrix H represented in Equation (1), Equation (6) performs a calculation of $Q=\phi_1(|D'_2-\alpha_{12}|/2)+\phi_1(|D'_3-\alpha_{13}|/2)+\phi_1(|D'_4-\alpha_{14}|/2)$.

The FF 428 and the FF 429 retain a calculated value R of the Equation (7) below.

$$R=\phi_1(|D'_{n'}-\alpha_{mn'}|/2) \tag{7}$$

In the row processing at the first row of the check matrix H represented in Equation (1), Equation (7) calculates the calculated value R as $\phi_1(|D'_2-\alpha_{12}|/2)$, $\phi_1(|D'_3-\alpha_{13}|/2)$, and $\phi_1(|D'_4-\alpha_{14}|/2)$.

The Q−R calculator 430 reads the calculated value Q from the FF 427 and the calculated value R from the FF 429, and calculates Q−R. In the row processing at the first row of the check matrix H represented in Equation (1), the Q−R calculator 430 calculates $Q-R=\phi_1(|D'_3-\alpha_{13}|/2)+\phi_1(|D'_4-\alpha_{14}|/2)$, $Q-R=\phi_1(|D'_2-\alpha_{12}|/2)+\phi_1(|D'_4-\alpha_{14}|/2)$, and $Q-R=\phi_1(|D'_2-\alpha_{12}|/2)+\phi_1(|D'_3-\alpha_{13}|/2)$. The Q−R calculator 430 then inputs $Q-R=\phi_1(|D'_3-\alpha_{13}|/2)+\phi_1(|D'_4-\alpha_{14}|/2)$, $Q-R=\phi_1(|D'_2-\alpha_{12}|/2)+\phi_1(|D'_4-\alpha_{14}|/2)$, and $Q-R=\phi_1(|D'_2-\alpha_{12}|/2)+\phi_1(|D'_3-\alpha_{13}|/2)$ sequentially to the ½ divider 431.

The ½ divider 431 sequentially receives $Q-R=1(|D'_3-\alpha_{13}|/2)+(|D'_4-\alpha_{14}|/2)$, $Q-R=\phi_1(|D'_2-\alpha_{12}|/2)+\phi_1(|D'_4-\alpha_{14}|/2)$, and $Q-R=\phi_1(|D'_2-\alpha_{12}|/2)+\phi_1(|D'_3-\alpha_{13}|/2)$ from the Q−R calculator 430, and divides each by 2. The ½ divider 431 then inputs $(Q-R)/2=\{\phi_1(|D'_3-\alpha_{13}|/2)+\phi_1(|D'_4-\alpha_{14}|/2)\}/2$, $(Q-R)/2=\phi_1(|D'_2-\alpha_{12}|/2)+\phi_1(|D'_4-\alpha_{14}|/2))/2$, and $(Q-R)/2=\{\phi_1(|D'_2-\alpha_{12}|/2)\phi_1(|D'_3-\alpha_{13}|/2))\}/2$ sequentially to the $\phi_2$ unit 432.

When $(Q-R)/2=\{(|(|D'_3-\alpha_{13}|/2)+\phi_1(|D'_4-\alpha_{14}|/2)\}/2$, $(Q-R)/2=\{\phi_1(|D'_2-\alpha_{12}|/2+\phi_1(|D'_4-\alpha_{14}|/2)\}/2$, and $(Q-R)/2=\{\phi_1(|D'_2-\alpha_{12}|/2)+\phi_1(|D'_3-\alpha_{13}|/2))\}/2$ are sequentially received from the ½ divider 431, the $\phi_2$ unit 432 then sequentially calculates the absolute values $|\alpha_{12}|$, $|\alpha_{13}|$, and $|\alpha_{14}|$ from Equation (5) above, by referring to the $\phi_2$ table (see FIG. 6). The $\phi_2$ unit 432 then inputs the absolute values $|\alpha_{12}|$, $|\alpha_{13}|$, and $|\alpha_{14}|$ sequentially to the FF 433. The absolute values $|\alpha_{12}|$, $|\alpha_{13}|$ and $|\alpha_{14}|$ in the FF 433 are read by the selector 404, which will be described later.

Referring back to FIG. 3, when $D'_n-\alpha_{mn}$ on is received from the subtractor 401, the second calculator 403 calculates $|\alpha_{mn}|$ that is the absolute value of $\alpha_{mn}$ by performing row processing that is based on a decoding algorithm having a lower error correction capacity than that used by the first calculator 402. In the explanation of the embodiment, it is assumed that the decoding algorithm used in the second calculator 403 is a min-sum algorithm (MSA).

The row processing performed by the second calculator 403 will now be explained.

Figure 7:
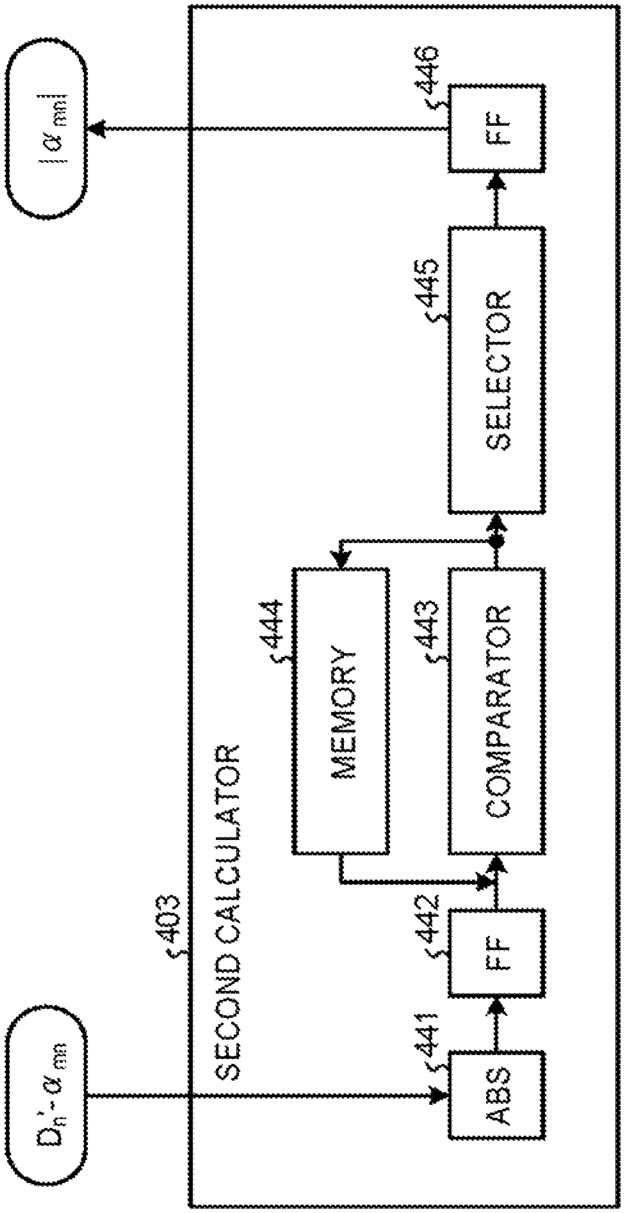
FIG. 7 is a schematic illustrating an exemplary configuration of a second calculator according to the embodiment.

FIG. 7 is a schematic illustrating an exemplary configuration of the second calculator 403 according to the embodiment. The second calculator 403 according to the embodiment includes an ABS calculator 441, an FF 442, a comparator 443, a memory 444, a selector 445, and an FF 446.

The second calculator 403 performs the operation of Equation (8) below.

$$|\alpha_{mn}|=\min_{n'\in A(m)\backslash n}(|D_{n'}-\alpha_{mn'}|) \tag{8}$$

Because m, n, A(m), and A(m)\n are the same as those in Equation (5) above, explanation thereof are omitted herein.

The process performed by the second calculator 403 will now be explained specifically, using the example of the row processing at the first row of the check matrix H represented in Equation (1). Because m=1, and A(1)={2, 3, 4}, the ABS calculator 441 receives $D'_2-\alpha_{12}$, $D'_3-\alpha_{13}$, and $D'_4-\alpha_{14}$ sequentially from the subtractor 401. The ABS calculator 441 sequentially calculates the absolute value of each of $|D'_2-\alpha_{12}|$, $|D'_3-\alpha_{13}|$, and $|D'_4-\alpha_{14}|$, and inputs the absolute values $|D'_2-\alpha_{12}|$, $|D'_3-\alpha_{13}$, and $|D'_4-\alpha_{14}|$ sequentially to the FF 442.

The comparator 443 inputs the smallest and the second smallest of the absolute values $|D'_2-\alpha_{12}|$, $|D'_3-\alpha_{13}|$, and $|D'_4-\alpha_{14}|$ to the selector 445. The memory 444 is used for the comparing process performed by the comparator 443. The memory 444 stores therein the smallest and the second smallest absolute values. Specifically, the comparator 443 receives the absolute value $|D'_2-\alpha_{12}|$ from the FF 442, and stores the absolute value $|D'_2-\alpha_{12}|$ in the memory 444. The comparator 443 then receives the absolute value $|D'_3-\alpha_{13}|$ from the FF 442, and stores the absolute value $|D'_3-\alpha_{13}|$ in the memory 444. When the absolute value $|D'_4-\alpha_{14}|$ is received from the FF 442, the comparator 443 then compares the absolute value $|D'_4-\alpha_{14}|$ with the absolute values $|D'_2-\alpha_{12}|$ and $|D'_3-\alpha_{13}|$ stored in the memory 444. The comparator 443 then inputs the smallest and the second smallest of the absolute values $|D'_2-\alpha_{12}|$, $|D'_3-\alpha_{13}|$, and $|D'_4-\alpha_{14}|$ to the selector 445.

Explained now in the embodiment is an example in which $|D'_2-\alpha_{12}|<|D'_3-\alpha_{13}|<|D'_4-\alpha_{14}|$, and the comparator 443 inputs $|D'_2-\alpha_{12}|$ and $|D'_3-\alpha_{13}|$ to the selector 445.

When $|D'_2-\alpha_{12}|$ and $|D'_3-\alpha_{13}|$ are received from the comparator 443, the selector 445 inputs the absolute values $|\alpha_{12}|$, $|\alpha_{13}|$, and $|\alpha_{14}|$ sequentially to the FF 446 by selecting $|D'_2-\alpha_{12}|$ or $|D'_3-\alpha_{13}|$ based on Equation (8) above. Specifically, because $|D'_2-\alpha_{12}|$ is the smallest and $|D'_3-\alpha_{13}|$ is the second smallest, $|\alpha_{12}|=|D'_3-\alpha_{13}|$, $|\alpha_{13}|=|D'_2-\alpha_{12}|$, $|\alpha_{14}|=|D'_2-\alpha_{12}|$. The absolute values $\alpha_{12}|$, $|\alpha_{13}|$, and $|\alpha_{14}|$ in the FF 446 are read by the selector 404, which will be described later.

Referring back to FIG. 3, the selector 404 selects $|\alpha_{mn}$ with a smaller operation error from $|\alpha_{mn}|$ received from the first calculator 402 and $|\alpha_{mn}|$ received from the second calculator 403, based on a determination condition, and inputs $|\alpha_{mn}|$ to the multiplier 406.

An operation error by the first calculator 402 will now be explained. The first calculator 402 performs the operation of Gallager's function f(x) using the $\phi_1$ table (see FIG. 5) and $\phi_2$ table (see FIG. 6).

Figure 8:
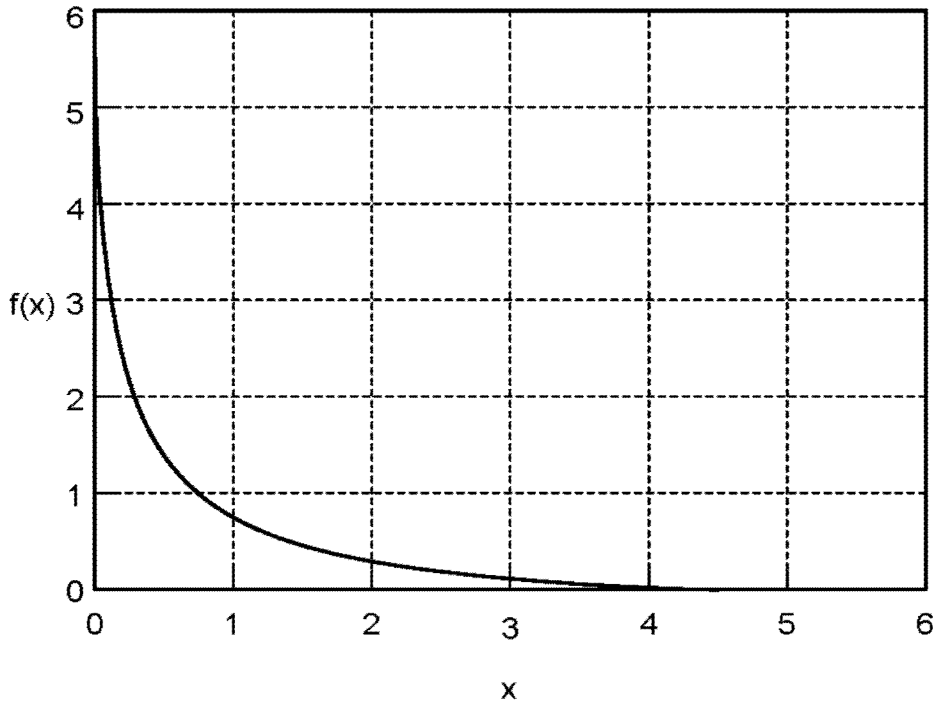
FIG. 8 is a schematic illustrating Gallager's function f(x)

FIG. 8 is a schematic illustrating Gallager's function f(x). "x" plotted to the horizontal axis represents the input value x expressed in the floating-point system in the $\phi_1$ table and the $\phi_2$ table. As illustrated in FIG. 8, when $x\to 0$, $f(x)=-\log(\tan h(x/2))\to\infty$. In the $\phi_1$ table and the $\phi_2$ table, however, because the upper boundary is set so that an input of x=0 results in an output value f(x) of approximately 5.5 in the expression in the floating-point system, the operation error in the output value f(x) increases as x approaches 0 further.

$D'_n$ is updated every time row processing is executed. While errors are corrected by the row processing normally, the reliability of $D'_n$ is improved, and the absolute value of $D'_n$ increases. When the decoding iteration is performed once (in other words, the row processing at all of the rows is completed), $D'_n$ is updated in a number equal to the column weight of the $n^{th}$ column. Therefore, as the decoding iteration count of row processing is increased, the absolute value of $D'_n$ becomes extremely large. Therefore, there would be a tendency for the input value $x(=|D'_n-\alpha_{mn}|)$ input to the $\phi_1$ table to be greater, and for an input value x input to the $\phi_2$ table tends to be smaller, and as a result, the error from $\phi_2(x)$ is increased. SPA-based row processing performed by the first calculator 402 has a high error correction capacity, however the error in the output value $\phi_2(x)$ increases as the decoding iteration count is increased.

For example, assuming that the check matrix H has a row weight of 3, and the input values x in the $\phi_1$ table are 13, 10, and 9, the output value $\phi_2(x)=|\alpha|$ from the $\phi_2$ table will all be 5.5 (in the floating-point system), which is at the upper boundary. By contrast, the output values $|\alpha|$ resulting from actual use of Gallager's function will be about 8.68, 8.98, and 9.95 (in the floating-point system), respectively. In such a case, if the decoding apparatus 40 performs the SPA-based row processing using the $\phi_1$ table and the $\phi_2$ table, there would be an operation error with respect to the result acquired from the actual use of Gallager's function. Therefore, the probability at which the decoding fails is increased.

Given the input values x of 13, 10, and 9, however, the row processing of the second calculator 403 outputs $|\alpha|$ of 9, 9, and 10 based on Equation (8) above. Therefore, the row processing of the second calculator 403 has a smaller operation error with respect to the result acquired from the actual use of Gallager's function, than that acquired from the row processing performed by the first calculator 402.

In other words, the necessary condition for a SPA-based row processing using the $\phi_1$ table and the $\phi_2$ table to have an operation error is for all of the input values x to the $\phi_1$ table to be greater than 5.5 (in the floating-point system), which is the maximum output from the $\phi_2$ table.

The selector 404 selects one of $|\alpha_{mn}|$ received from the first calculator 402 and $|\alpha_{mn}|$, received from the second calculator 403 based on a determination condition, and inputs the selected $|\alpha_{mn}|$ to the multiplier 406. An exemplary determination condition will now be explained.

<Example 1 in which the Absolute Values $|D'_n-\alpha_{mn}|$ of the Input Values Input to the First Calculator 402 and the Second Calculator 403 are Used as a Reference>

The output value $\phi_2(x)$ in the $\phi_2$ table increases as the input value x approaches 0, and the operation error in the output value $\phi_2(x)$ is increased when the input value x approaches 0. Therefore, if the smallest one of the absolute values $|D'_n-\alpha_{mn}|$ of $D'_n$— $\alpha_{mn}$ input to the first calculator 402 is equal to or greater than a threshold (first threshold), the selector 404 selects $|\alpha_{mn}|$ received from the second calculator 403, and if the smallest one of the absolute values $|D'_n-\alpha_{mn}|$ input to the first calculator 402 is smaller than the threshold, the selector 404 may select $|\alpha_{mn}|$ received from the first calculator 402.

In this manner, it is possible to use the output value $|\alpha_{mn}|$ from the row processing of the first calculator 402 when the operation error of the first calculator 402 is small, and to use the output value $|\alpha_{mn}|$ from the row processing of the second calculator 403 when the operation error of the first calculator 402 is large.

<Example 1 in which the absolute values $|D'_n-\alpha_{mn}|$ of the input values input to the first calculator 402 and the second calculator 403 are used as a reference> explained above corresponds to FirstMin in the simulation result explained later in a modification of the embodiment (see FIGS. 13A to 14C).

<Example 2 in which the Absolute Values $|D'_n-\alpha_{mn}|$ of the Input Values Input to the First Calculator 402 and the Second Calculator 403 are Used as a Reference>

The input value $D'_n-\alpha_{mn}$, input to the first calculator 402 is less reliable when the absolute value $|D'_n-\alpha_{mn}|$ of the input value is smaller. In other words, $D'_n-\alpha_{mn}$ with the smallest absolute value $|D'_n-\alpha_{mn}|$ is least reliable. In the row processing of the smallest absolute value $|D'_n-\alpha_{mn}|$, a plurality of $|D'_n-\alpha_{mn}|$ that are the second least reliable through the most reliable are used. Therefore, when the second least reliable $|D'_n-\alpha_{mn}|$ is equal to or greater than a threshold (second threshold), the operation error in the row processing of the least reliable $|D'_n-\alpha_{mn}|$ increases.

If $D'_n-\alpha_{mn}$ with the second smallest absolute value, among those input to the first calculator 402, is equal to or greater than the threshold (second threshold), the selector 404 selects $|\alpha_{mn}|$ received from the second calculator 403. If the $D'_n-\alpha_{mn}$ with the second smallest absolute value, among those input to the first calculator 402, is not equal to or greater than the threshold, the selector 404 may select $|\alpha_{mn}|$ received from the first calculator 402.

Compared with determining the output value $|\alpha_{mn}$ of $D'_n-\alpha_{mn}$ with the smallest absolute value, among a plurality of $D'_n-\alpha_{mn}$ input to the first calculator 402, against a threshold, an operation error resulting from the row processing of the least reliable $D'_n-\alpha_{mn}$ can be reduced. Therefore, a higher error correction effect can be achieved.

<Example 2 in which the absolute values $|D'_n-\alpha_{mn}|$ of the input values input to the first calculator 402 and the second calculator 403 are used as a reference> corresponds to SecondMin in the simulation result explained later in the modification of the embodiment (see FIGS. 13A to 14C).

The smallest and the second smallest of a plurality of $|D'_n-\alpha_{mn}|$ are acquired by the row processing of the second calculator 403. Therefore, when the selector 404 performs the threshold determination, the selector 404 may use the results of the row processing of the second calculator 403, instead of the absolute values of the input values $|D'_n-\alpha_{mn}|$ input to the first calculator 402 and the second calculator 403.

<Example in which the Decoding Iteration Count of Row Processing is Used as a Reference>

There is a tendency that, when the decoding iteration count of row processing increases, the input value x to the $\phi_2$ table is decreased, and the output value $\phi_2(x)$ is increased. The selector 404 therefore may perform a threshold determination using the decoding iteration count of row processing performed by the first calculator 402 (using a third threshold). In other words, if the decoding iteration count is equal to or smaller than the threshold, the selector 404 may select $|\alpha_{mn}|$ received from the first calculator 402, and if the decoding iteration count is greater than the threshold, the selector 404 may select $|\alpha_{mn}|$ received from the second calculator 403. In this manner, the output value resultant of the row processing performed by the first calculator 402 can be used when the operation error of the first calculator 402 is small, and the output value resultant of the row processing performed by the second calculator 403 can be used when the operation error of the first calculator 402 is large.

As the thresholds used in the determination by the selector 404, any threshold may be used depending on the environment in which the decoding apparatus is implemented. The necessary condition for the SPA-based row processing using the $\phi_1$ table and $\phi_2$ table to have an operation error is for all of the input values $|D'_n-\alpha_{mn}|$ input to the first calculator 402 and the second calculator 403 to be greater than the maximum output value of the $\phi_2$ table, which is 5.5 (in the floating-point system). Therefore, the first threshold and the second threshold must be greater than a maximum output value T of the $\phi_2$ table.

<Example in which the decoding iteration count of row processing is used as a reference> described above corresponds to Cnt in the simulation result explained later in a modification of the embodiment (see FIGS. 13A to 14C).

The selector 404 may also combine the threshold determination using the absolute value of the input values input to the first calculator 402 and the second calculator 403, and the threshold determination using the decoding iteration count of row processing performed by the first calculator 402.

For example, if the decoding iteration count of row processing performed by the first calculator 402 is greater than the threshold, the selector 404 may perform the threshold determination using the smallest or the second smallest of the absolute values of the input values to the first calculator 402. In other words, if the decoding iteration count of row processing performed by the first calculator 402 is equal to or smaller than the threshold, the selector 404 selects the output value resultant of the row processing performed by the first calculator 402. If the decoding iteration count of row processing performed by the first calculator 402 is greater than the threshold, the selector 404 may select the output value resultant of the row processing performed by the first calculator 402, or the output value resultant of the row processing performed by the second calculator 403, depending on the smallest or the second smallest one of the absolute values of the input values input to the first calculator 402.

The combination of <Example 2 in which the absolute values $|D'_n-\alpha_{mn}|$ of the input values input to the first calculator 402 and the second calculator 403 are used as a reference> described above and <Example in which the decoding iteration count of row processing is used as a reference> described above corresponds to SecondMin & Cnt in the simulation result explained later in a modification of the embodiment (see FIGS. 13A to 13C).

The code value calculator 405 reads the row processing operation probability value $\alpha_{mn}$ from the row processing memory 45, and calculates sign($\alpha_{mn}$) from Equation (9) below.

$$\mathrm{sign}(\alpha_{mn}) = \prod_{n' \in A(m)\backslash n} \mathrm{sign}(\alpha_{mn'}) \tag{9}$$

Because m, n, A(m), and A(m)\n are the same as those described for Equation (5) above, the explanations thereof are omitted herein. Here, sign(an) represents signed $\alpha_{mn}$ (1 or −1). The code value calculator 405 inputs sign(an) to the multiplier 406.

When $|\alpha_{mn}|$ is received from the selector 404, and sign ($\alpha_{mn}$) is received from the code value calculator 405, the multiplier 406 calculates $\alpha_{mn}$(out) from $\alpha_{mn}$(out)=sign ($\alpha_{mn}$)×$|\alpha_{mn}|$. The multiplier 406 then stores $\alpha_{mn}$(out) in the row processing memory 45. The multiplier 406 also inputs $\alpha_{mn}$(out) to the adder 407.

When $D'_n-\alpha_{mn}$ is received from the subtractor 401, and $\alpha_{mn}$(out) is received from the multiplier 406, the adder 407 calculates $D'_n$(out) from $D'_n$(out)=$D'_n-\alpha_{mn}+\alpha_{mn}$(out). The adder 407 then stores $D'_n$(out) in the decoded data memory 42.

A decoding method according to the embodiment will now be explained. Explained in the embodiment is an example in which the reception data R has a data length of six. The reception data R is expressed as R=($R_1$, $R_2$, $R_3$, $R_4$, $R_5$, $R_6$).

Figure 9:
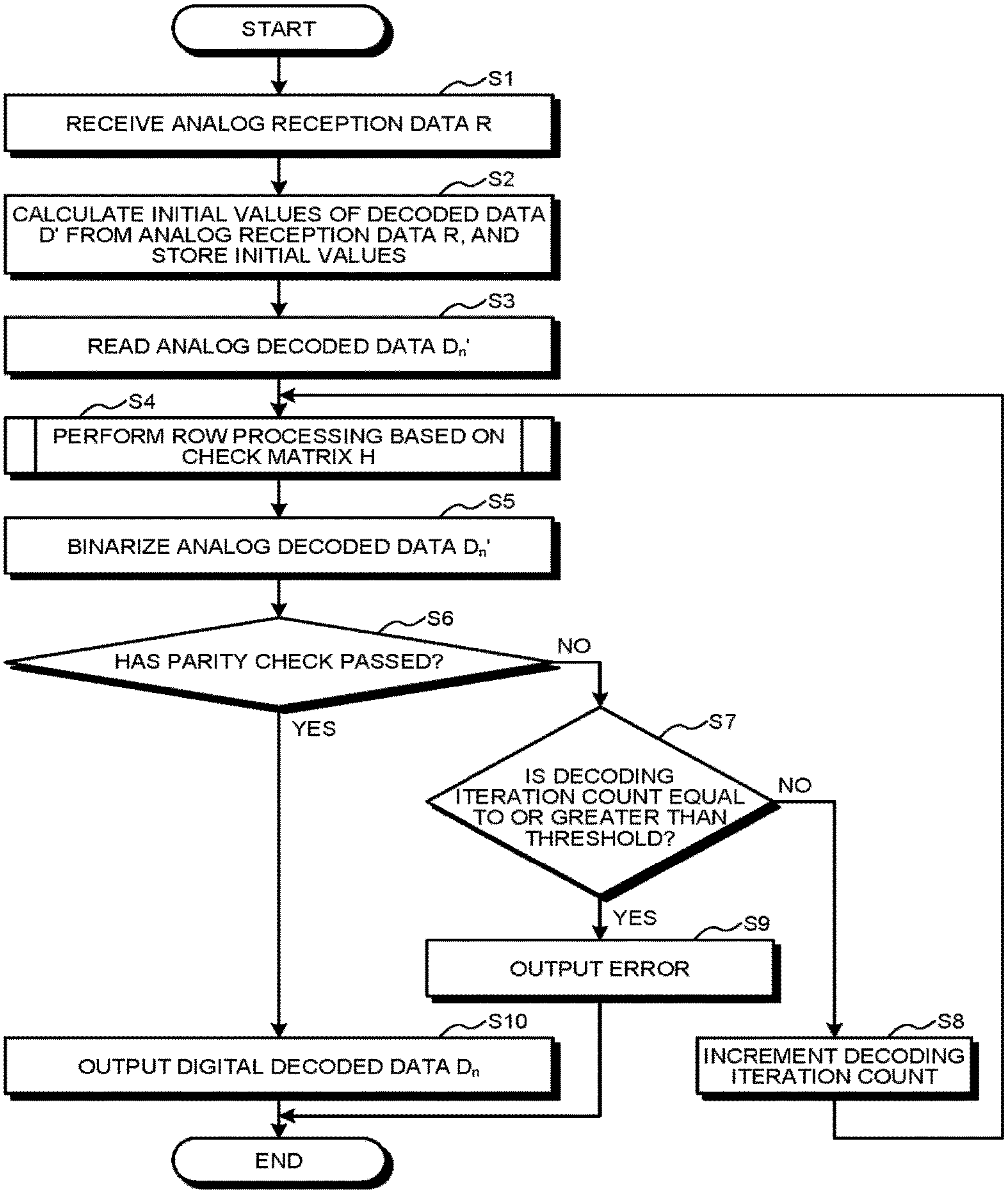
FIG. 9 is a flowchart illustrating an exemplary operation performed by the decoding apparatus according to the embodiment.

FIG. 9 is a flowchart illustrating an exemplary operation performed by the decoding apparatus according to the embodiment. To begin with, the receiver 41 receives the analog reception data R=($R_1$, $R_2$, $R_3$, $R_4$, $R_5$, $R_6$) from the encoding apparatus 20 over the communication channel 30 (Step S1). The receiver 41 then calculates the initial values of the analog decoded data D'=($D_1$, $D_2$, $D_3$, $D_4$, $D_5$, $D_6$) from the analog reception data R=($R_1$, $R_2$, $R_3$, $R_4$, $R_5$, $R_6$), and stores the initial values in the decoded data memory 42 (Step S2).

The row processor 43 then reads the analog decoded data $D'_n$ from the decoded data memory 42 (where n represents the column number with a component "1" in the row to be row-processed) (Step S3). The row processor 43 then corrects errors in the analog reception data R by performing the row processing at each of the rows in the check matrix H (Step S4). Step S4 will be explained later in detail with reference to FIG. 10. As a result of the process at Step S4, the analog decoded data $D'_n$ stored in the decoded data memory 42 and the row processing probability values $\alpha_{mn}$ stored in the row processing memory 45 are updated.

The binarizer 46 then converts the analog decoded data D'=($D'_1$, $D'_2$, $D'_3$, $D'_4$, $D'_5$, $D'_6$) into binary decoded data D=($D_1$, $D_2$, $D_3$, $D_4$, $D_5$, $D_6$) via a threshold determination (Step S5).

The checker 47 then determines whether the parity check of the binary decoded data D=($D_1$, $D_2$, $D_3$, $D_4$, $D_5$, $D_6$) has passed (Step S6). Specifically, if the syndrome S calculated from S=D×$H^T$=($S_1$, $S_2$, $S_3$) is (0, 0, 0), the checker 47 determines that the parity check has passed.

If the parity check has passed (Yes at Step S6), the checker 47 outputs the digital decoded data D=($D_1$, $D_2$, $D_3$, $D_4$, $D_5$, $D_6$) (Step S10).

If the parity check has failed (No at Step S6), the checker 47 determines whether the decoding iteration count of row processing performed by the first computing apparatus is equal to or greater than the threshold (fourth threshold) (Step S7).

If the decoding iteration count is smaller than the threshold (Yes at Step S7), the checker 47 increments the decoding iteration count (Step SB), and the decoding process returns to Step S4.

If the decoding iteration count is equal to or greater than the threshold (No at Step S7), the checker 47 outputs an error indicating that the digital decoded data D=($D_1$, $D_2$, $D_3$, $D_4$, $D_5$, $D_6$) cannot be acquired from the analog reception data R=($R_1$, $R_2$, $R_3$, $R_4$, $R_5$, $R_6$) (Step S9).

The row processing at Step S4 using the check matrix H will now be explained in detail.

Figure 10:
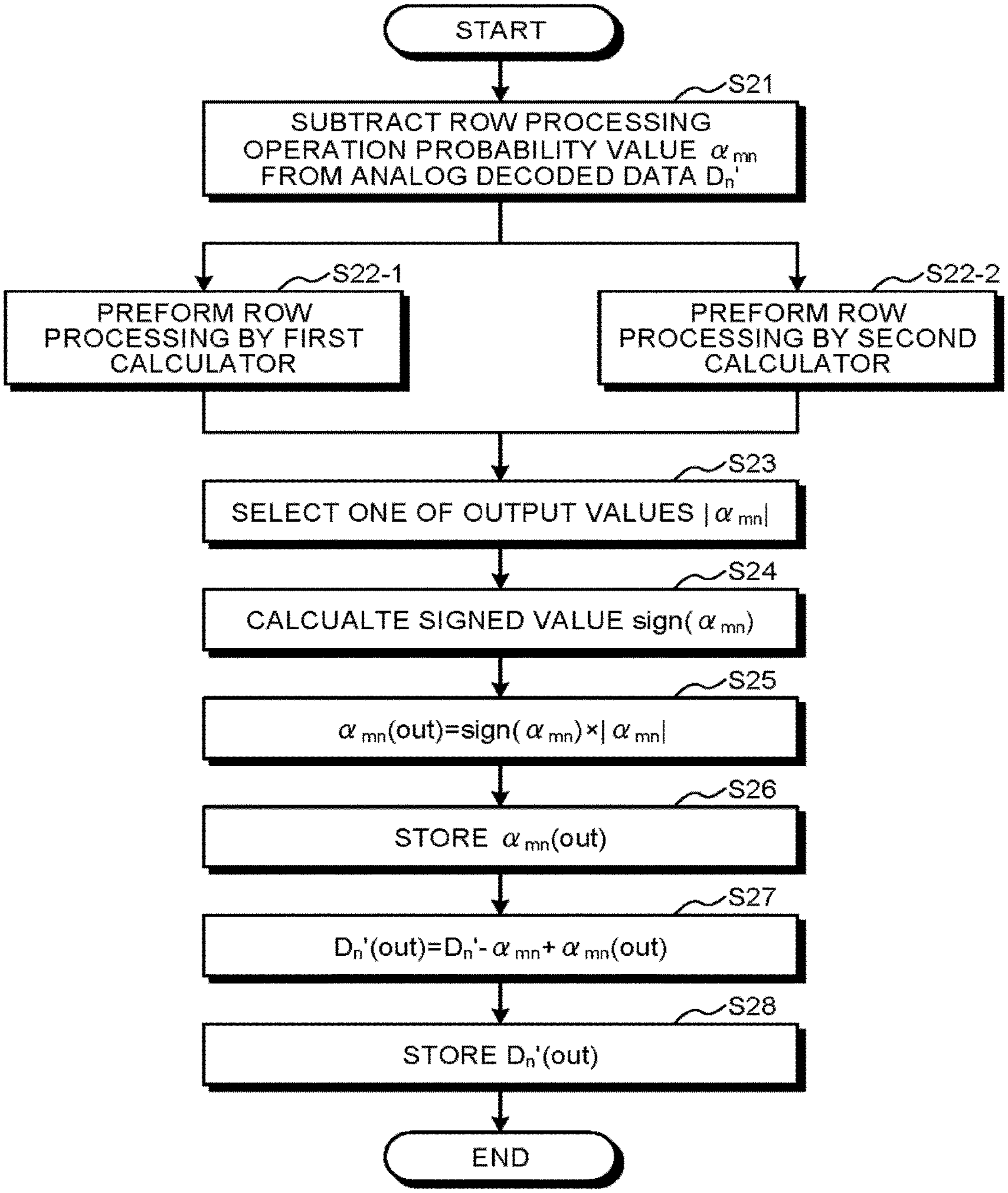
FIG. 10 is a flowchart illustrating an exemplary operation performed by the row processor according to the embodiment.

FIG. 10 is a flowchart illustrating an exemplary operation of the row processor 43 according to the embodiment. To begin with, the subtractor 401 reads the analog decoded data $D'_n$ from the decoded data memory 42, and row processing operation probability values $\alpha_{mn}$ from the row processing memory 45, and calculates $D'_n-\alpha_{mn}$ (Step S21).

The first calculator 402 then performs the row processing based on the decoding algorithm with a higher error correction capacity than that used by the second calculator 403 (Step S22-1). Explained in the embodiment is an example in which the decoding algorithm used by the first calculator 402 is the SPA with the operation of Gallager's function $f(x)=-\log(\tan h(x/2))$ replaced by an operation using tables storing therein pairs of an input value x and an output value f(x).

The second calculator 403 also performs the row processing based on a decoding algorithm having a lower error correction capacity than that used by the first calculator 402 (Step S22-2). Explained in the embodiment is an example in which the decoding algorithm used in the second calculator 403 is the MSA.

The selector 404 then selects one of the output value $|\alpha_{mn}|$ from the row processing at Step S22-1 or the output value $|\alpha_{mn}|$ from the row processing at Step S22-2, based on the determination condition described above (Step S23).

The code value calculator 405 then calculates the signed value sign ($\alpha_{mn}$) from Equation (9) above (Step S24). The multiplier 406 then calculates $\alpha_{mn}$(out) from $\alpha_{mn}$(out)=sign ($\alpha_{mn}$)×$|\alpha_{mn}|$ (Step S25). The multiplier 406 then stores $\alpha_{mn}$(out) in the row processing memory 45 (Step S26).

The adder 407 then calculates $D'_n$(out) from $D'_n$(out)= $D'_n-\alpha_{mn}+\alpha_{mn}$(out) (Step S27). The adder 407 then stores $D'_n$(out) in the decoded data memory 42 (Step S28).

As described above, in the decoding apparatus 40 according to the embodiment, the first calculator 402 performs the row processing based on the first decoding algorithm (that is the SPA implementing Gallager's function f(x) with an operation using tables, in the example explained in the embodiment). The second calculator 403 then performs the row processing based on a second decoding algorithm having a lower error correction capacity than that of the first decoding algorithm (that is the MSA, in the example explained in the embodiment). If the error in the output value resultant of the row processing of the first calculator 402 is greater than the error in the output value resultant of the row processing of the second calculator 403, the selector 404 selects the output value resultant of the row processing of the second calculator 403. Therefore, with the decoding apparatus 40 according to the embodiment, the LDPC code decoding process can be performed more precisely, even with limited available resources in the decoding apparatus 40.

The second decoding algorithm used by the second calculator 403 may also be an offset-minsum algorithm, or an adaptive-offset-minsum algorithm, for example.

Modification of Embodiment

A modification of the embodiment will now be explained. In the modification of the embodiment, the communication system 10 is configured differently from that according to the embodiment described above. In the description of the modification, the differences with the embodiment will be explained, while omitting the explanations that are the same as those in the embodiment. Also explained in the modification are the results of simulations in which the decoding apparatus 40 performs the row processing in the communication system 10 according to the modification.

Figure 11:
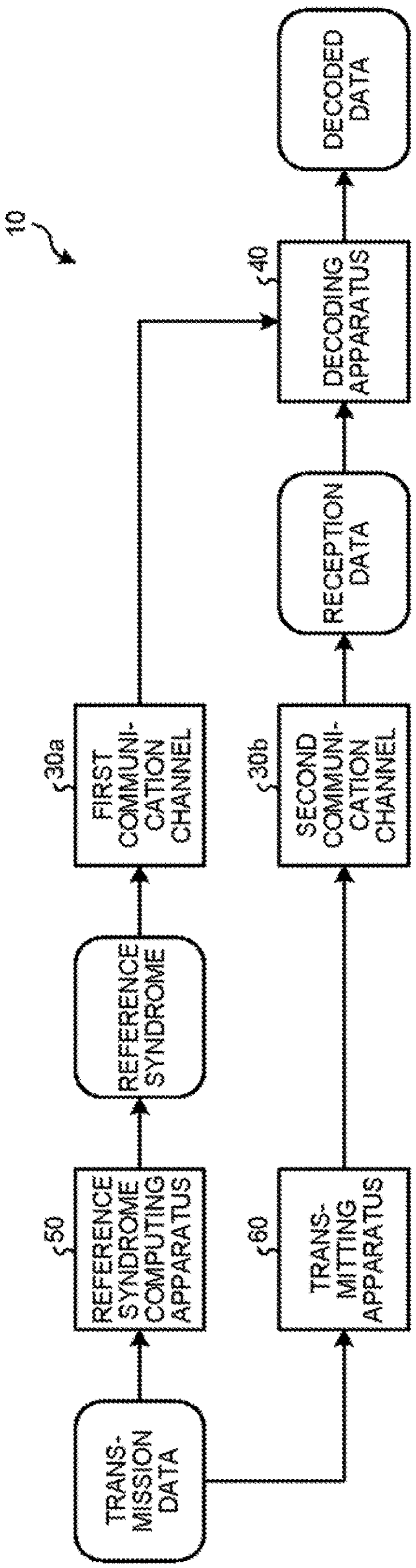
FIG. 11 is a schematic illustrating an exemplary configuration of a communication system according to a modification of the embodiment.

FIG. 11 is a schematic illustrating an exemplary configuration of the communication system 10 according to the embodiment. The communication system 10 according to the embodiment includes a decoding apparatus 40, a reference syndrome computing apparatus 50, and a transmitting apparatus 60. The decoding apparatus 40 and the reference syndrome computing apparatus 50 are connected via a first communication channel 30*a*. The first communication channel 30*a* is a medium used in transmitting a reference syndrome. The reference syndrome is generated by the reference syndrome computing apparatus 50. Specifically, the reference syndrome computing apparatus 50 generates a reference syndrome by multiplying the transposed matrix of the check matrix H to a piece of transmission data. The reference syndrome computing apparatus 50 then transmits the reference syndrome to the decoding apparatus 40 via the first communication channel 30*a*.

The decoding apparatus 40 and the transmitting apparatus 60 are connected to each other via a second communication channel 30*b*. The second communication channel 30*b* is a medium used in transmitting the transmission data. The transmitting apparatus 60 transmits the transmission data to the decoding apparatus 40 via the second communication channel 30*b*.

The decoding apparatus 40 receives the reference syndrome from the reference syndrome computing apparatus 50 via the first communication channel 30*a*. When a piece of reception data is received from the transmitting apparatus 60 via the second communication channel 30*b*, the decoding apparatus 40 generates decoded data (transmission data) by correcting errors in the reception data based on the reference syndrome. Specifically, the decoding apparatus 40 generates the decoded data by repeating the row processing of the reception data until the syndrome generated by multiplying the transposed matrix of the check matrix H to the reception data matches the reference syndrome.

The first communication channel 30*a* and the second communication channel 30*b* may be a wireless channel or a wired channel, or may be a combination of a wireless channel and a wired channel. The first communication channel 30*a* and the second communication channel 30*b* may be the same communication channel 30, although the decoding apparatus 40 needs to be ensured that the syndrome is received with no error.

The results of the simulations in which the decoding apparatus 40 performs the row processing in the communication system 10 according to the modification will now be explained.

To begin with, the communication channel model of the second communication channel 30*b* will be explained. Examples of a communication channel model include an additive white Gaussian noise (AWGN) model and a binary symmetric channel (BSC) model. When the communication channel model is BSC, an initial value "a" of the analog decoded data $D'_n$ in the decoding apparatus 40 is determined based on bER. Specifically, if the reception data $R_n$ is 0, "a"=log {(1−bER)/bER}. If the reception data $R_n$ is 1, "a"=−log {(1−bER)/bER}. bER herein is the error rate of the BSC. In the description of the simulation results according to the modification, the BSC is used as the communication channel model for the second communication channel 30*b*.

FIG. 12A is a schematic illustrating a first exemplary check matrix H according to the modification. FIG. 12A illustrates an example in which the check matrix H has a row weight from 19 to 23, and a column weight of 3 or 11. The check matrix has a row size of 19712 bits, and a column size of 75392 bits. In other words, the first exemplary check matrix H is a matrix of 19712 rows by 75392 columns. The "ratio" represents a ratio in the number of rows (columns) having a row weight (column weight) with respect to the number of entire rows (number of entire columns) of the check matrix H. For example, the rows having a row weight of 21 occupy 29.8701 percent of the number of entire rows of the check matrix H.

FIG. 12B is a schematic illustrating a second exemplary check matrix according to the modification. The check matrix has a row size of 24576 bits, and a column size of 86016 bits. In other words, the second exemplary check matrix H is a matrix of 24576 rows by 86016 columns. FIG. 12C is a schematic illustrating a third exemplary check matrix according to the modification. The check matrix has a row size of 31488 bits, and a column size of 84608 bits. In other words, the third exemplary check matrix H is a check matrix of 31488 rows by 84608 columns. Because the descriptions of FIG. 12B and FIG. 12C are the same as that of FIG. 12A, these descriptions are omitted herein.

The results of simulations using the check matrixes H illustrated in FIGS. 12A to 12C will now be explained with reference to FIGS. 13A to 14C, respectively.

FIG. 13A is a schematic presenting values of results of a simulation performed with the first exemplary check matrix. FIG. 13B is a schematic presenting values of results of a simulation performed with the second exemplary check matrix. FIG. 13C is a schematic presenting values of results of a simulation performed with the third exemplary check matrix. "bER" denotes the error rate of the second communication channel 30*b*. The "decoding failure rate" denotes the probability at which the decoded data D cannot be acquired from the reception data R.

Figure 14A:
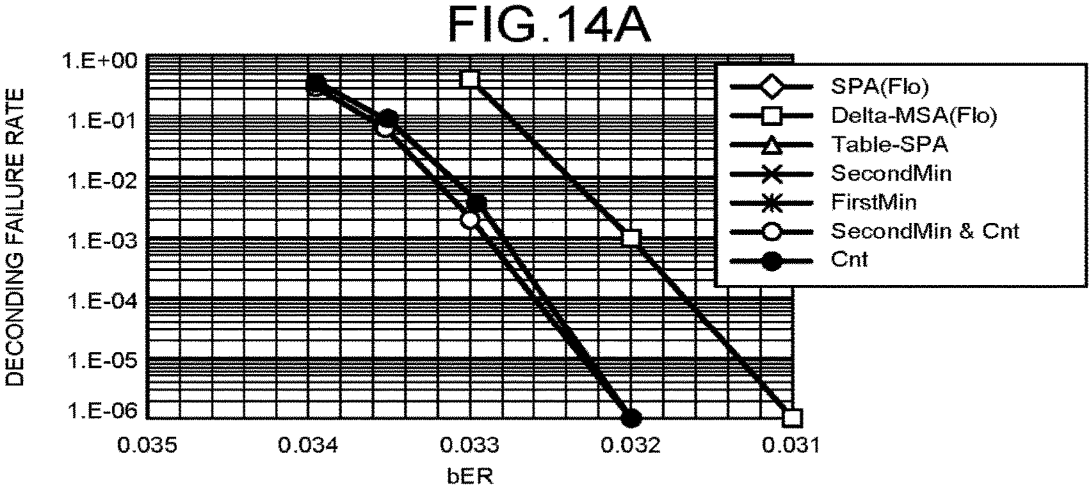
FIG. 14A is a graph presenting the results of the simulation performed with the first exemplary check matrix.
Figure 14B:
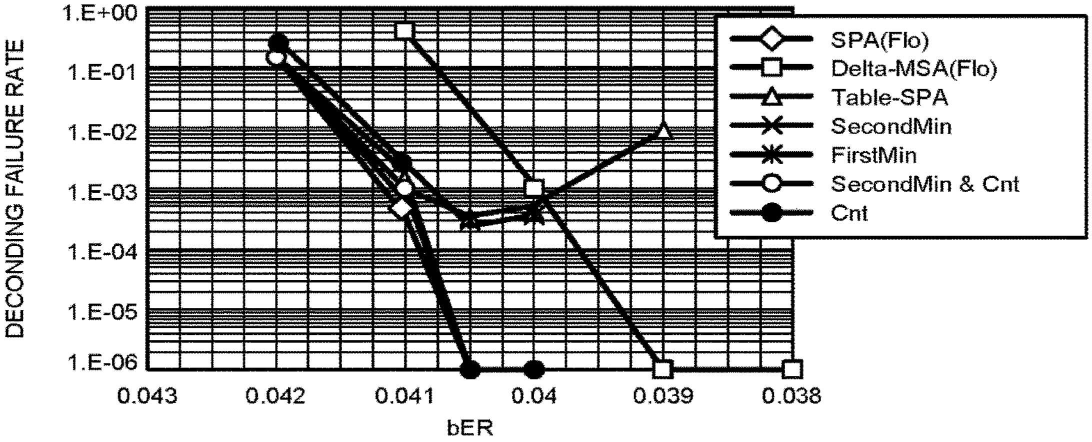
FIG. 14B is a graph presenting the results of the simulation performed with the second exemplary check matrix.
Figure 14C:
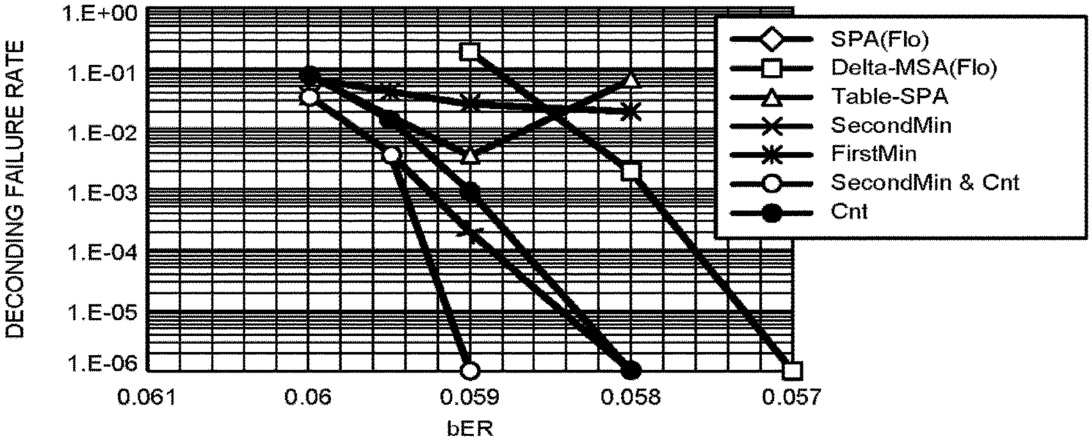
FIG. 14C is a graph presenting the results of the simulation performed with the third exemplary check matrix.

FIG. 14A is a graph presenting the results of the simulation performed with the first exemplary check matrix. FIG. 14B is a graph presenting the results of the simulation performed with the second exemplary check matrix. FIG. 14C is a graph presenting the results of the simulation performed with the third exemplary check matrix. The horizontal axis represents bER, and the vertical axis represents the decoding failure rate.

SPA(Flo) represents a decoding method in which SPA is performed in the floating-point system. In other words, SPA(Flo) represents the SPA in which the operation of Gallager's function $f(x)=-\log(\tan h(x/2))$ is not replaced with the operation using the $\phi_1$ table and the $\phi_2$ table.

Delta-MSA(Flo) represents a decoding method performing δ-MSA is the floating-point system. For δ-MSA, see Sakai, L., Matsumoto, W., and Yoshida H., "Low Complexity Decoding Algorithm for LDPC Codes and Its Discretized Density Evolution: Performance Evaluation for δ-Min Decoding by Discretized Density Evolution", Technical report of IEICE, RDC2005-42.

Table-SPA represents a decoding method in which the SPA is performed using the $\phi_1$ table and the $\phi_2$ table in the fixed-point system, in replacement of the operation of Gallager's function $f(x)=-\log(\tan h(x/2))$. In other words, Table-SPA corresponds to the row processing performed by the first calculator 402 described above.

SecondMin represents the decoding method using <Example 2 in which the absolute values $|D'_n-\alpha_{mn}|$ of the input values input to the first calculator 402 and the second calculator 403 are used as a reference> described in the embodiment.

FirstMin represents the decoding method using <Example 1 in which the absolute values $|D'_n-\alpha_{mn}|$ of the input values input to the first calculator 402 and the second calculator 403 are used as a reference> described in the embodiment.

SecondMin & Cnt represents the decoding method using a combination of <Example 2 in which the absolute values $|D'_n-\alpha_{mn}|$ of the input values input to the first calculator 402 and the second calculator 403 are used as a reference> and <Example in which the decoding iteration count of row processing is used as a reference> described in the embodiment.

Cnt represents the decoding method using <Example in which the decoding iteration count of row processing is used as a reference> described in the embodiment.

Among the decoding methods described above, the decoding apparatus 40 according to the modification uses SecondMin, FirstMin, SecondMin & Cnt, and Cnt.

Simulations conditions will now be explained.

In the simulations, when a piece of data is decoded by an operation in the fixed-point system, one piece of decoded data D has a bit width of 9 bits including 6 bits for the integer part and 3 bits for the decimal part. The row processing operation probability value $\alpha_{mn}$ has a bit width of 7 bits including 4 bits for integer part and 3 bits for decimal part. Table-SPA, SecondMin, FirstMin, SecondMin & Cnt, and Cnt perform their decoding using operations in the fixed-point system.

The $\phi_1$ table and the $\phi_2$ table have the same configurations as those illustrated in FIGS. 5 and 6, respectively, explained in the embodiment. The threshold for FirstMin (first threshold), and the threshold for SecondMin (second threshold) are both 6, which is a rounded maximum output value 5.5 in the $\phi_2$ table (in the floating-point system), rounded at the decimal point. The threshold for decoding iteration count used in Cnt (third threshold) is 30. The thresholds for SecondMin & Cnt are a decoding iteration count of 10 or more (third threshold), and the second smallest absolute value of 6 or greater (second threshold), among the absolute values of the input values input to the first calculator 402. Before using these thresholds in determinations in the actual decoding, these thresholds are converted into a fixed-point system having the same bit width as that of the row processing operation probability value $\alpha_{mn}$.

The simulation results will now be explained.

SPA(Flo) exhibited the best performance across the entire simulation results using all of the check matrixes H. However, a hardware implementation of SPA(Flo), for example, might result in an increased circuit scale, compared with the other decoding methods.

Delta-MSA(Flo) exhibited the lowest performance among the simulation results using the check matrix H illustrated in FIG. 12A (see FIGS. 13A and 14A). Delta-MSA(Flo) also exhibited rather low performance in the simulation results using the check matrix H illustrated in FIG. 12B (see FIGS. 13B and 14B), compared with the other decoding methods. Delta-MSA(Flo), however, exhibited a higher performance than Table-SPA and FirstMin when bER is around 0.039 to 0.04. Delta-MSA(Flo) also exhibited a rather low performance among the simulation results using the check matrix H illustrated in FIG. 12C (see FIGS. 13C and 14C), than the other decoding methods, but exhibited a higher performance than Table-SPA and FirstMin when bER is around 0.058 to 0.0585.

Table-SPA exhibited a performance equivalent to that of Cnt in the simulation results using the check matrix H illustrated in FIG. 12A (see FIGS. 13A and 14A). Table-SPA exhibited a performance equivalent to that of FirstMin in the simulation results using the check matrix H illustrated in FIG. 12B (see FIGS. 13B and 14B). In these cases, the performance of Table-SPA deteriorated when bER was around 0.0405 or lower. Table-SPA also exhibited lower performance in the simulation results using the check matrix H illustrated in FIG. 12C (see FIGS. 13C and 14C) when bER was around 0.059 or lower.

A cause of the deterioration in the performance of Table-SPA using the check matrixes H illustrated in FIGS. 12B and 12C will now be explained. The smallest row weights of the respective check matrixes H in FIGS. 12A, 12B, and 12C are 19, 13, and 11, respectively.

Generally, there is a tendency that, while the row processing is correcting errors normally, the absolute value of the output value $\alpha_{mn}$(out) resultant of the row processing increases. The increase width is greater, when the row weight is smaller. For example, when the row weight is 8, and all of $D'_n-\alpha_{mn}$ input to the operating unit running the SPA have an absolute value of 5, $|\alpha_{mn}(\text{out})|$ will be approximately 2.92. By contrast, when the row weight is 4, and all of $D'_n-\alpha_{mn}$ input to the operating unit running the SPA have an absolute value of 5, $|_{mn}(\text{out})|$ will be approximately 3.61. With Table-SPA as well, the increase width is greater when the row weight is smaller, in the same manner as in SPA.

When the row processor 43 updates $D'_n$ after the row processing is completed, $D'_n$(out) is calculated from $D'_n-\alpha_{mn}+\alpha_{mn}(\text{out})$. Therefore, when the row weight becomes smaller, the increase width of the absolute value of $D'_n$ becomes greater. When the decoding iteration is performed once (that is, when the row processing at all of the rows is completed), $D'_n$ is updated by the number equal to the column weight of the $n^{th}$ column. Denoting the maximum $\alpha_{mn}$ that is based on the bit width as $\alpha_{mn}$(max), $D'_n$ approaches the column weight$\times\alpha_{mn}$(max) while the error correction of the reception data $R_n$ is going well. With Table-SPA, therefore, the absolute value $|D'_n-\alpha_{mn}|$ input to the operating unit is increased, so that Table-SPA is more likely to experience an operation error.

For this reason, the performance of Table-SPA deteriorated with the check matrixes illustrated in FIGS. 12B and 12C, having the smallest row weight that is smaller than that in the check matrix H illustrated in FIG. 12A. With the check matrix H illustrated in FIG. 12C, the smallest row weight of which is the smallest among those of the check matrixes H, in particular, Table-SPA exhibited a higher decoding failure rate.

SecondMin exhibited a performance equivalent to SPA (Flo), FirstMin, and SecondMin & Cnt in the simulation results using the check matrix H illustrated in FIG. 12A (see FIGS. 13A and 14A. SecondMin also exhibited a performance equivalent to SPA(Flo), and SecondMin & Cnt in the simulation results using the check matrix H illustrated in FIG. 12B (see FIGS. 13B and 14B). SecondMin exhibited the second highest performance in the simulation results using the check matrix H illustrated in FIG. 12C (see FIGS. 13C and 14C).

FirstMin exhibited a performance equivalent to SPA(Flo), SecondMin, and SecondMin & Cnt in the simulation results using the check matrix H illustrated in FIG. 12A (see FIGS. 13A and 14A). FirstMin exhibited a performance equivalent to Table-SPA in the simulation results using the check matrix H illustrated in FIG. 12B (see FIGS. 13B and 14B). FirstMin exhibited a rather low performance, compared with the other decoding methods, in the simulation results using the check matrix H illustrated in FIG. 12C (see FIGS. 13C and 14C).

Comparing First-Min with Second-Min, Second-Min exhibited a higher performance. This is because First-Min has a greater operation error in correcting the least reliable data, than Second-Min.

SecondMin & Cnt exhibited a performance equivalent to SPA(Flo) in the all of the simulation results using the check matrixes H. In other words, SecondMin & Cnt exhibited the best performance in the all of the simulation results using the check matrixes H. In SecondMin & Cnt, the operation of Gallager's function $f(x)=-\log(\tan h(x/2))$ is replaced with operations using the $\phi_1$ table and the $\phi_2$ table. Therefore, SecondMin & Cnt can also reduce the circuit scale, compared with a hardware implementation of SPA(Flo). Furthermore, a software implementation of SecondMin & Cnt can reduce the table size by using the $\phi_1$ table and the $\phi_2$ table described above, compared with when the operation of Gallager's function $f(x)=-\log(\tan h(x/2))$ is implemented with a table.

Cnt exhibited a performance equivalent to Table-SPA in the simulation results using the check matrix H illustrated in FIG. 12A (see FIGS. 13A and 14A). Cnt exhibited a standard performance, compared with the other decoding methods, in the simulation results using the check matrix H illustrated in FIG. 12B (see FIGS. 13B and 14B). Cnt also exhibited a standard performance, compared with the other decoding methods, in the simulation results using the check matrix H illustrated in FIG. 12C (see FIGS. 13C and 14C).

In the modification, the BSC is used as the communication channel model of the second communication channel 30*b*, but the same applies even when the AWGN is used for the second communication channel 30*b*.

Furthermore, the MSA is used as the algorithm of the second calculator 403, but any algorithm may be used as long as such an algorithm is capable of acquiring the output of the row processing from the smallest and the second smallest of a plurality of $|D'_n-\alpha_{mn}|$ that are calculated from the input values $D'_n$ to the row processor 43 and $\alpha_{mn}$. Possible alternatives include the offset-minsum algorithm (O-MSA) disclosed in Jinghu Chen, "Density evolution for two improved BP-based decoding algorithms of LDPC codes", IEEE Commun. Lett., vol. 6, pp. 208-210 2002, the adaptive-offset-minsum algorithm (AO-MSA) disclosed in Ming Jiang, Chunming Zhao, Li Zhang, and Enyang Xu, "Adaptive Offset Min-Sum Algorithm for Low-Density Parity Check Codes", IEEE COMMUNICATIONS LETTERS, VOL. 10, NO. 6, June 2006, pp. 483-485, and the normalized-minsum algorithm (N-MSA) disclosed in Rong Chen, Yi-Ming Wang, "Modified Normalized Min-Sum Decoding of LDPC Codes", ICSP 2008 Proceedings. Looking at the decoding operations disclosed in these references, the O-MSA and the AO-MSA subtract a constant offset from $|\alpha_{mn}|$ updated by the MSA. The N-MSA changes the result of the MSA update at a constant ratio.

Therefore, the O-MSA, the AO-MSA, and the N-MSA are capable of reducing the operation error compared with Table-SPA, even for an input of $|D'_n-\alpha_{mn}|$ resulting in an operation error in Table-SPA. It is therefore possible to use the O-MSA, the AO-MSA, or the N-MSA as exemplary algorithms for the second calculator 403.

The function of the decoding apparatus 40 according to the embodiment may be implemented by a computer program. Finally, an exemplary hardware configuration for implementing the decoding apparatus 40 according to the embodiment by a computer program will now be explained.

Figure 15:
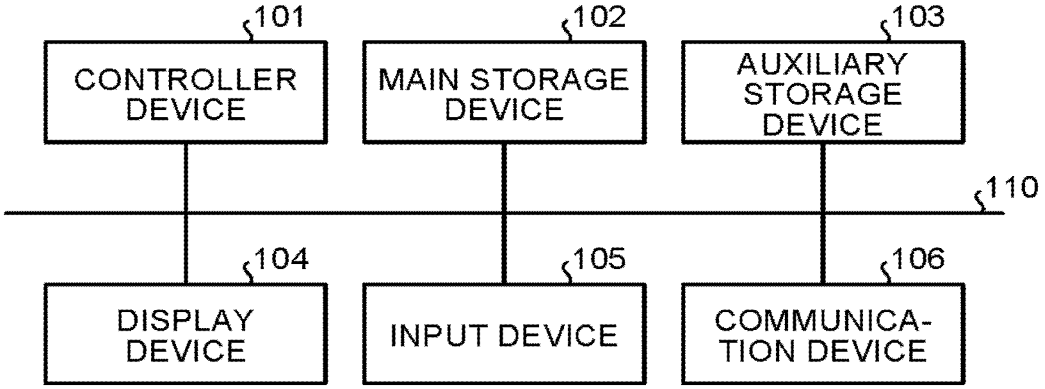
FIG. 15 is a schematic illustrating an exemplary hardware configuration of the decoding apparatus according to the embodiment.

FIG. 15 is a schematic of an exemplary hardware configuration of the decoding apparatus 40 according to the embodiment. The decoding apparatus 40 according to the embodiment includes a controller device 101, a main storage device 102, an auxiliary storage device 103, a display device 104, an input device 105, and a communication device 106.

The controller device 101, the main storage device 102, the auxiliary storage device 103, the display device 104, the input device 105, and the communication device 106 are connected to one another via a bus 110. Examples of the decoding apparatus 40 include a smart device and a personal computer.

The controller device 101 executes a computer program read onto the main storage device 102 from the auxiliary storage device 103. The main storage device 102 is a memory such as a read-only memory (ROM) and a random access memory (RAM). The auxiliary storage device 103 is, for example, a memory card or a solid state drive (SSD).

The display device 104 displays information. An example of the display device 104 includes a liquid crystal display. The input device 105 receives inputs of information. An example of the input device 105 includes a keyboard. The display device 104 and the input device 105 may be a liquid crystal touch panel, for example, having a display function and an input function. The communication device 106 communicates with other devices.

The computer program executed in the decoding apparatus 40 is provided as a computer program product, in a manner stored in a computer-readable storage medium such as a compact disc read-only memory (CD-ROM), a memory card, a compact disc recordable (CD-R), or a digital versatile disc (DVD), as a file in an installable or executable format.

The computer program executed in the decoding apparatus 40 may be stored in a computer connected to a network such as the Internet, and made available for download over the network. The computer program executed in the decoding apparatus 40 may be provided over a network such as the Internet, without allowing the computer program to be downloaded.

The computer program of the decoding apparatus 40 may be provided in a ROM or the like in advance.

The computer program executed in the decoding apparatus 40 has a modular structure including functional blocks that can be implemented by the computer program, among the elements (functional blocks) of the decoding apparatus 40 according to the embodiment explained above. Examples of the functional blocks that can be implemented by the computer program include the receiver 41, the row processor 43, the binarizer 46, and the checker 47.

The functional blocks implemented by the computer program are loaded onto the main storage device 102 by causing the controller device 101 to read the computer program from the storage medium such as the auxiliary storage device 103, and to execute the computer program. In other words, the functional blocks implemented by the computer program are generated on the main storage device 102.

The functional units of the decoding apparatus 40 according to the embodiment may also be implemented by a combination of a computer program and hardware such as an integrated circuit (IC).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A decoding apparatus for a low-density parity-check (LDPC) code, comprising:

a controller coupled to memory and configured to implement:

a first calculator;

a second calculator; and a first selector configured to select an output value from the first calculator or the second calculator based on a determination condition, wherein the first calculator comprises:

a first absolute value calculator configured to calculate a first absolute value representing an absolute value of an input value that is input to the first calculator;

a first ½ calculator configured to calculate a first input value x by dividing the first absolute value by 2;

a $\phi_1$ determiner configured to determine, by using first information including pairs of the first input value x and a first output value $\phi_1(x)=-\log(\tan h(x))$, the first output value $\phi_1(x)$ from the first input value x that is output from the first ½ calculator;

an adder configured to calculate a sum Q of first output values $\phi_1(x)$ that are output from the $\phi_1$ determiner;

a Q-R value calculator configured to select each of the first output values $\phi_1(x)$ output from the $\phi_1$ determiner as an R value in an output order and calculate a Q-R value representing a difference between the sum Q and the R value;

a second ½ calculator configured to calculate a second input value y by dividing the Q-R value by 2; and a $\phi_2$ determiner configured to determine, by using second information including pairs of the second input value y and a second output value $\phi_2(y)=-\log(\tan h(y))$, the second output value $\phi_2(y)$ from the second input value y that is output from the second ½ calculator and output the second output value $\phi_2(y)$ as the output value from the first calculator, and the second calculator comprises:

a second absolute value calculator configured to calculate a second absolute value representing an absolute value of an input value that is input to the second calculator;

a comparator configured to acquire, from among second absolute values that are output from the second absolute value calculator, smallest and second smallest of the second absolute values; and a second selector configured to output one of the smallest and the second smallest of the second absolute values as the output value from the second calculator.

2. The apparatus according to claim 1, wherein the determination condition is used to select an output value from the second calculator when smallest one of absolute values of a plurality of input values input to the first calculator is equal to or greater than a first threshold, and to select an output value from the first calculator when the smallest one of the absolute values of the input values input to the first calculator is smaller than the first threshold.

3. The apparatus according to claim 2, wherein a data format of the first information is a table storing therein the pairs of the first input value x and the first output value $\phi_1(x)=-\log(\tan h(x))$, and the first threshold is greater than a maximum output value in the table for determining the second output values $\phi_2(y)$ from the first calculator.

4. The apparatus according to claim 1, wherein the determination condition is used to select an output value from the second calculator when an input value having a second-smallest absolute value, among a plurality of input values input to the first calculator, is equal to or greater than a second threshold, and to select an output value from the first calculator when the input value having the second-smallest absolute value, among the input values input to the first calculator, is smaller than the second threshold.

5. The apparatus according to claim 4, wherein a data format of the first information is a table storing therein the pairs of the first input value x and the first output value $\phi_1(x)=-\log(\tan h(x))$, and the second threshold is greater than a maximum output value in the table for determining the second output values $\phi_2(y)$ from the first calculator.

6. The apparatus according to claim 1, wherein the determination condition is used to select an output value from the second calculator when a decoding iteration count of row processing is equal to or greater than a third threshold, and to select an output value from the first calculator when the decoding iteration count of row processing is smaller than the third threshold.

7. The apparatus according to claim 1, wherein the determination condition is used to select an output value from the second calculator when a decoding iteration count of row processing is equal to or greater than a third threshold, and when smallest one of a plurality of input values input to the first calculator is equal to or greater than a first threshold, and to select an output value from the first calculator when the decoding iteration count of row processing is smaller than the third threshold or smallest one of a plurality of input values input to the first calculator is smaller than the first threshold.

8. The apparatus according to claim 1, wherein the determination condition is used to select an output value from the second calculator when a decoding iteration count of row processing is equal to or greater than a third threshold and when an input value having a second-smallest absolute value, among a plurality of input values input to the first calculator, is equal to or greater than a second threshold, and to select an output value from the first calculator when the decoding iteration count of row processing is smaller than the third threshold or an input value having a second-smallest absolute value, among a plurality of input values input to the first calculator, is smaller than the second threshold.

9. A decoding method performed by a decoding apparatus of a low-density parity-check (LDPC) code, the method comprising:

performing, by a controller, first row processing;

performing, by the controller, second row processing; and selecting, by the controller, an output value from the first row processing or the second row processing based on a determination condition, wherein the first row processing:

calculates a first absolute value representing an absolute value of an input value;

calculates a first input value x by dividing the first absolute value by 2;

determines, by using first information including pairs of the first input value x and a first output value $\phi_1(x)=-\log(\tan h(x))$, the first output value $\phi_1(x)$ from the first input value x;

calculates a sum Q of first output values $\phi_1(x)$;

selects each of the first output values $\phi_1(x)$ as an R value in an output order and calculates a Q-R value representing a difference between the sum Q and the R value;

calculates a second input value y by dividing the Q-R value by 2; and determines, by using second information including pairs of the second input value y and a second output value $\phi_2(y)=-\log(\tan h(y))$, the second output value $\phi_2(y)$ from the second input value y and outputs the second output value $\phi_2(y)$ as the output value from the first row processing, and the second row processing:

calculates a second absolute value representing an absolute value of an input value;

acquires, from among second absolute values that are calculated, smallest and second smallest of the second absolute values; and outputs one of the smallest and the second smallest of the second absolute values as the output value from the second row processing.

10. A non-transitory computer-readable medium including computer-readable instructions for decoding a low-density parity-check (LDPC) code, the computer-readable instructions causing a controller that is coupled to memory to perform a method comprising:

performing first row processing;

performing second row processing; and selecting an output value from the first row processing-or the second row processing based on a determination condition, wherein the first row processing:

calculates a first absolute value representing an absolute value of an input value;

calculates a first input value x by dividing the first absolute value by 2;

determines, by using first information including pairs of the first input value x and a first output value $\phi_1(x)=-\log(\tan h(x))$, the first output value $\phi_1(x)$ from the first input value x;

calculates a sum Q of first output values $\phi_1(x)$;

selects each of the first output values $\phi_1(x)$ as an R value in an output order and calculates a Q-R value representing a difference between the sum Q and the R value;

calculates a second input value y by dividing the Q-R value by 2; and determines, by using second information including pairs of the second input value y and a second output value $\phi_2(y)=-\log(\tan h(y))$, the second output value $\phi_2(y)$ from the second input value y and outputs the second output value $\phi_2(y)$ as the output value from the first row processing, and the second row processing:

calculates a second absolute value representing an absolute value of an input value;

acquires, from among second absolute values that are calculated, smallest and second smallest of the second absolute values; and outputs one of the smallest and the second smallest of the second absolute values as the output value from the second row processing.

* * * * *